US012438117B2

(12) United States Patent
Marte et al.

(10) Patent No.: US 12,438,117 B2
(45) Date of Patent: Oct. 7, 2025

(54) DIE BONDING SYSTEMS, AND METHODS OF USING THE SAME

(71) Applicant: Kulicke and Soffa Industries, Inc., Fort Washington, PA (US)

(72) Inventors: Andreas Marte, Berg (CH); Daniel Buergi, Berg (CH); Urban Ernst, Berg (CH); Eirini Kakkava, Zurich (CH); Alexander Holzer, Zurich (CH); Mathias Moser, Zurich (CH); Fabian Schneider, Zurich (CH)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 379 days.

(21) Appl. No.: 17/988,974

(22) Filed: Nov. 17, 2022

(65) Prior Publication Data

US 2023/0163095 A1      May 25, 2023

Related U.S. Application Data

(60) Provisional application No. 63/281,948, filed on Nov. 22, 2021.

(51) Int. Cl.
  *H01L 23/00*          (2006.01)
(52) U.S. Cl.
  CPC .............. *H01L 24/74* (2013.01); *H01L 24/08* (2013.01); *H01L 24/80* (2013.01);
  (Continued)
(58) Field of Classification Search
  CPC ......... H01L 24/74; H01L 24/08; H01L 24/80; H01L 2224/0213; H01L 2224/08221;
  (Continued)

(56) References Cited

U.S. PATENT DOCUMENTS

| 7,597,234 B2 | 10/2009 | Blessing et al. |
| 9,243,894 B2 | 1/2016 | Yamauchi |

(Continued)

FOREIGN PATENT DOCUMENTS

| CN | 109643700 | | 9/2019 |
| CN | 111584415 A | * | 8/2020 |

(Continued)

OTHER PUBLICATIONS

International Search Report from PCT Application No. PCT/US2022/050215 completed Apr. 5, 2023.

*Primary Examiner* — S. Behrooz Ghorishi
(74) *Attorney, Agent, or Firm* — Christopher M. Spletzer, Sr.

(57) ABSTRACT

A die bonding system including a bond head assembly for bonding a die to a substrate is provided. The die includes a first plurality of fiducial markings, and the substrate includes a second plurality of fiducial markings. The die bonding system also includes an imaging system configured for simultaneously imaging one of the first plurality of fiducial markings and one of the second plurality of fiducial markings along a first optical path while the die is carried by the bond head assembly. The imaging system is also configured for simultaneously imaging another of the first plurality of fiducial markings and another of the second plurality of fiducial markings along a second optical path while the die is carried by the bond head assembly. Each of the first and second optical paths are independently configurable to image any area of the die including one of the first plurality of fiducial markings.

17 Claims, 28 Drawing Sheets

(52) U.S. Cl.
CPC .............. *H01L 2224/0213* (2013.01); *H01L 2224/08221* (2013.01); *H01L 2224/80007* (2013.01); *H01L 2224/8013* (2013.01); *H01L 2224/80132* (2013.01); *H01L 2224/8017* (2013.01); *H01L 2224/8018* (2013.01); *H01L 2224/80894* (2013.01); *H01L 2224/80986* (2013.01)

(58) Field of Classification Search
CPC ... H01L 2224/80007; H01L 2224/8013; H01L 2224/80132; H01L 2224/8017; H01L 2224/8018; H01L 2224/80894; H01L 2224/80986; H01L 23/544; H01L 2224/80004; H01L 2224/80908; H01L 24/741; H01L 2224/0217; H01L 2224/8012

See application file for complete search history.

(56) References Cited

U.S. PATENT DOCUMENTS

| | | | |
|---|---|---|---|
| 10,694,651 | B2 | 6/2020 | Lu |
| 10,861,819 | B1 | 12/2020 | Deng et al. |
| 11,289,422 | B2 | 3/2022 | Yan et al. |
| 2012/0127485 | A1* | 5/2012 | Yamauchi ............... H01L 24/75 356/614 |
| 2018/0114767 | A1* | 4/2018 | Wasserman ............. H01L 24/80 |
| 2018/0317353 | A1 | 11/2018 | Bilewicz et al. |
| 2019/0304852 | A1 | 10/2019 | Seyama |
| 2020/0379012 | A1 | 12/2020 | Yamasaki et al. |

FOREIGN PATENT DOCUMENTS

| | | |
|---|---|---|
| EP | 3761350 | 1/2021 |
| WO | 2020044580 | 3/2020 |

* cited by examiner

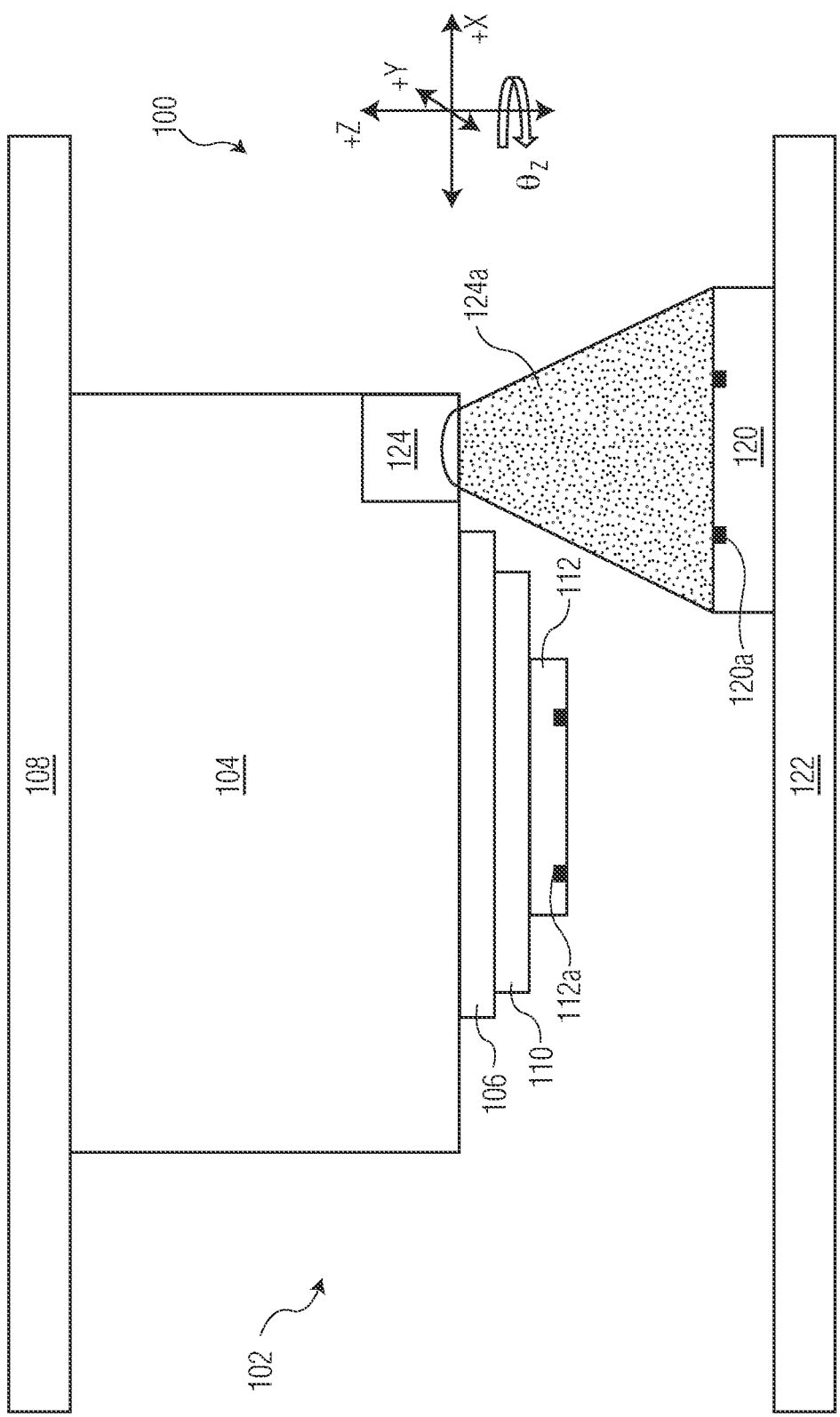

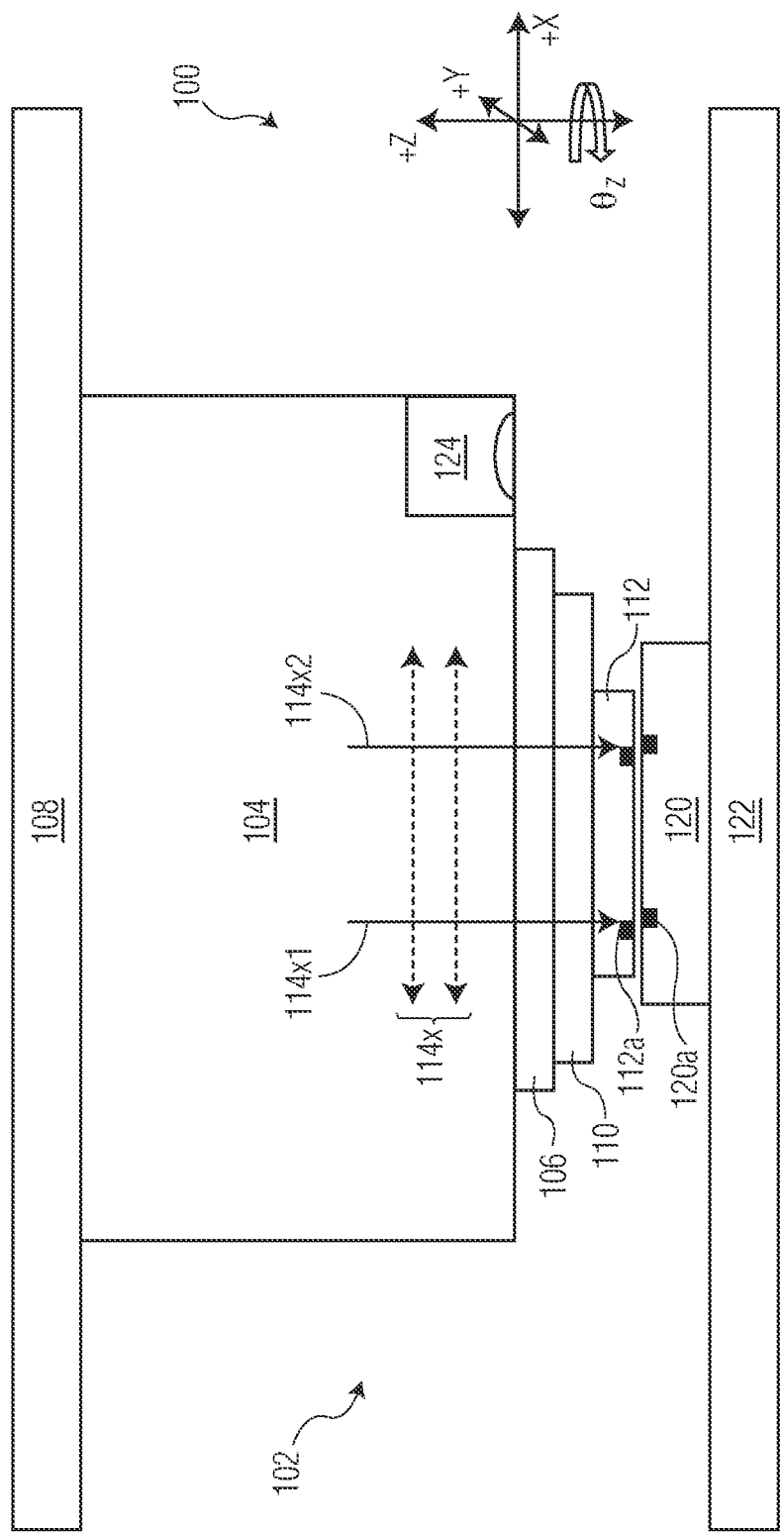

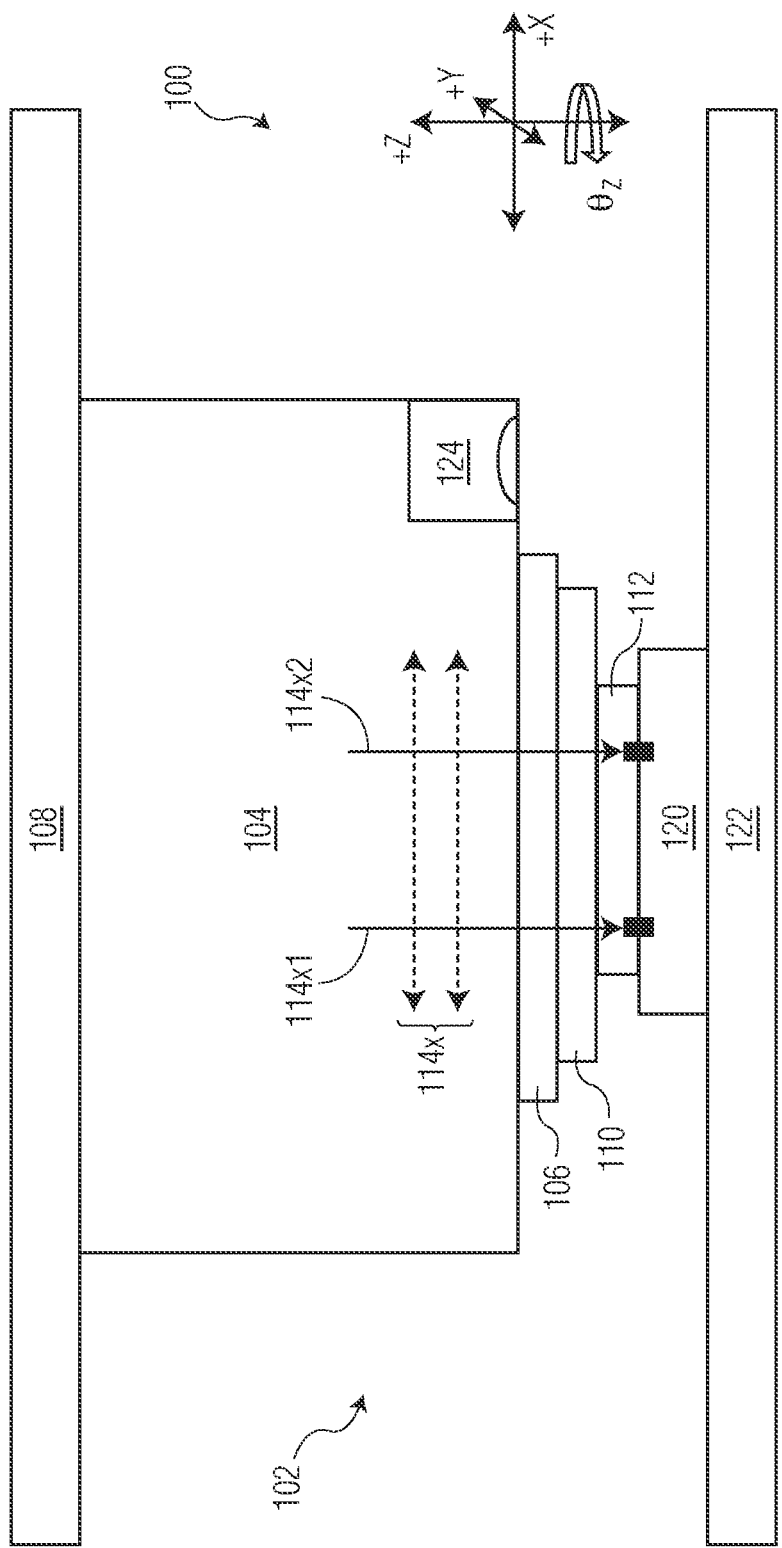

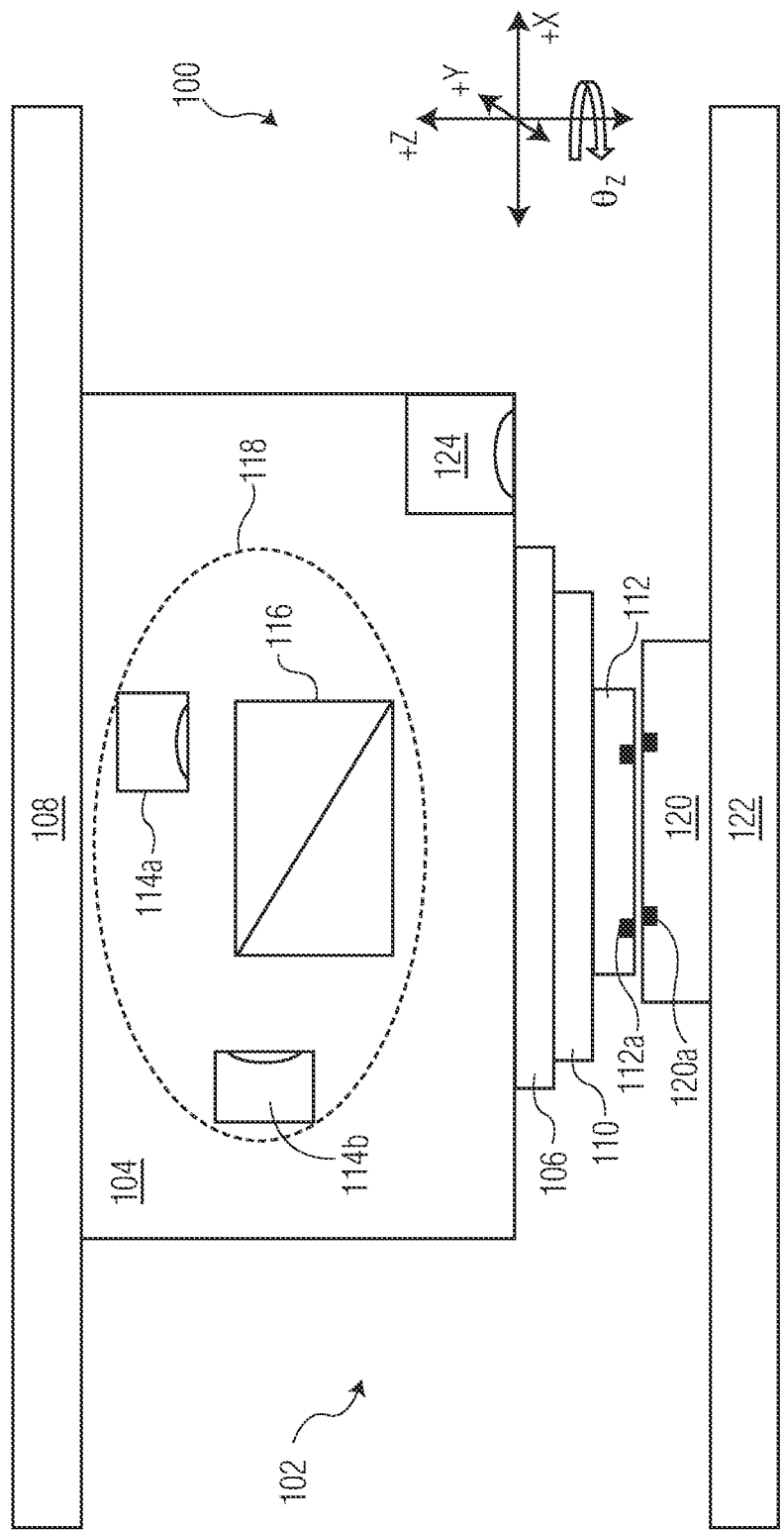

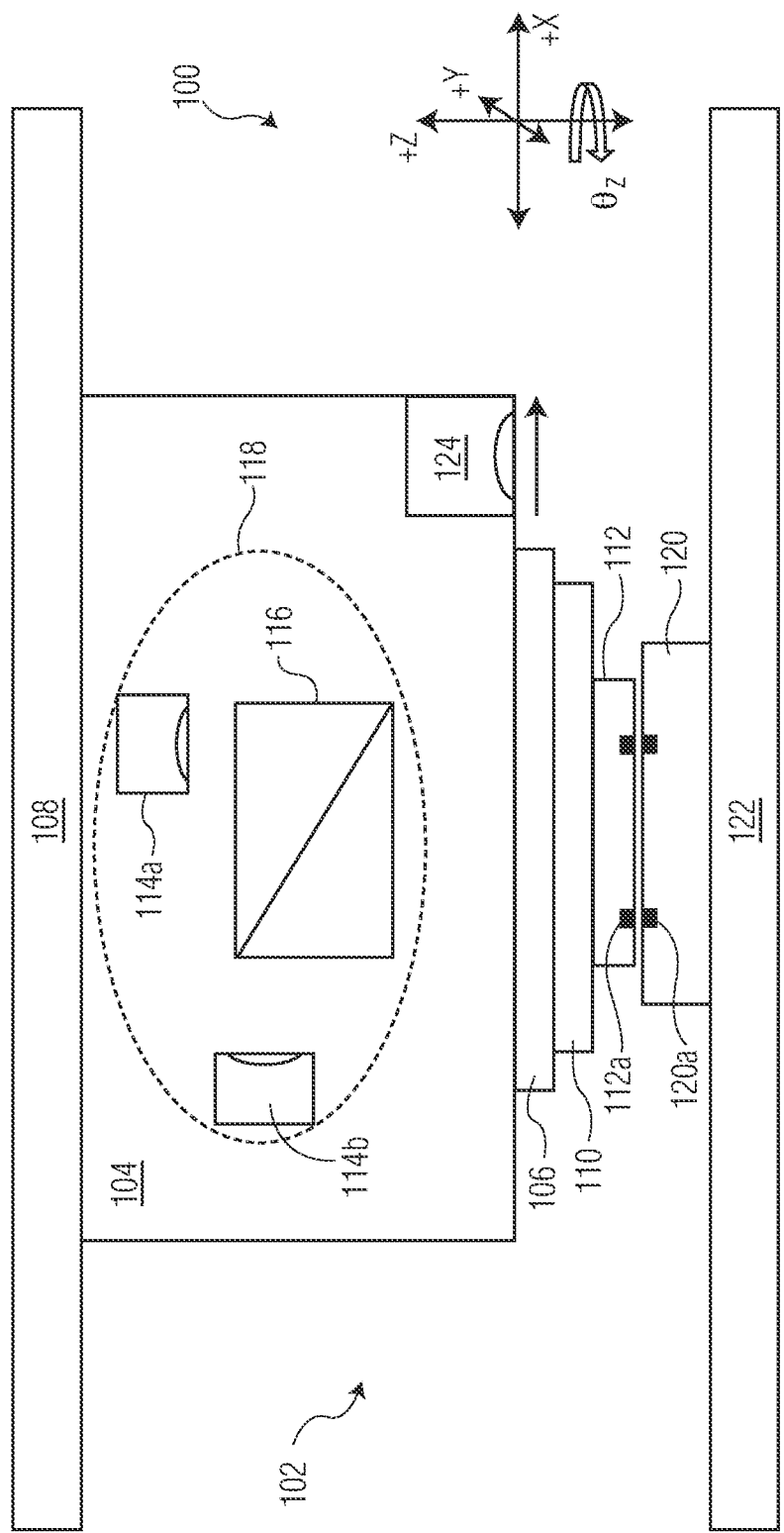

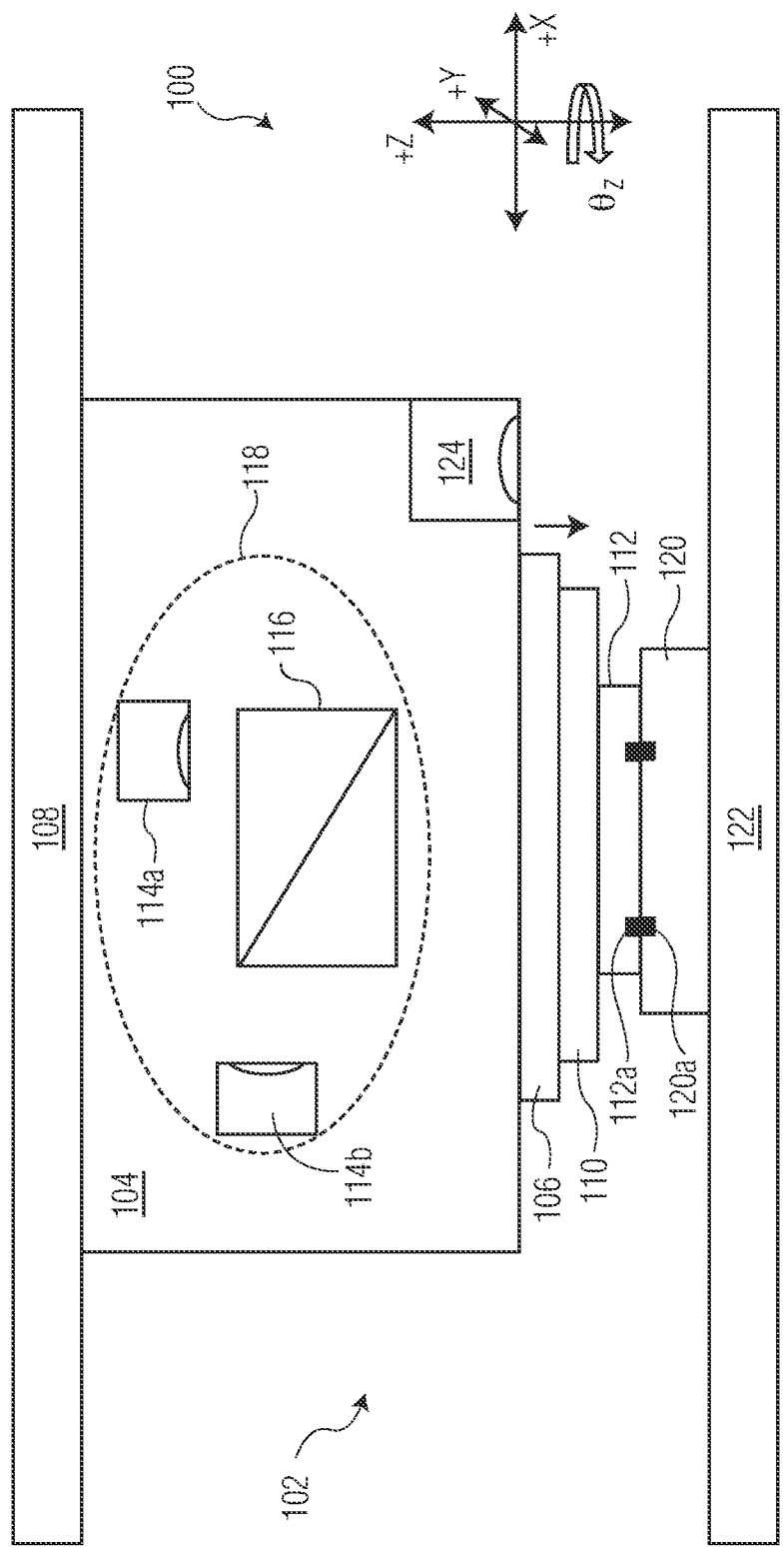

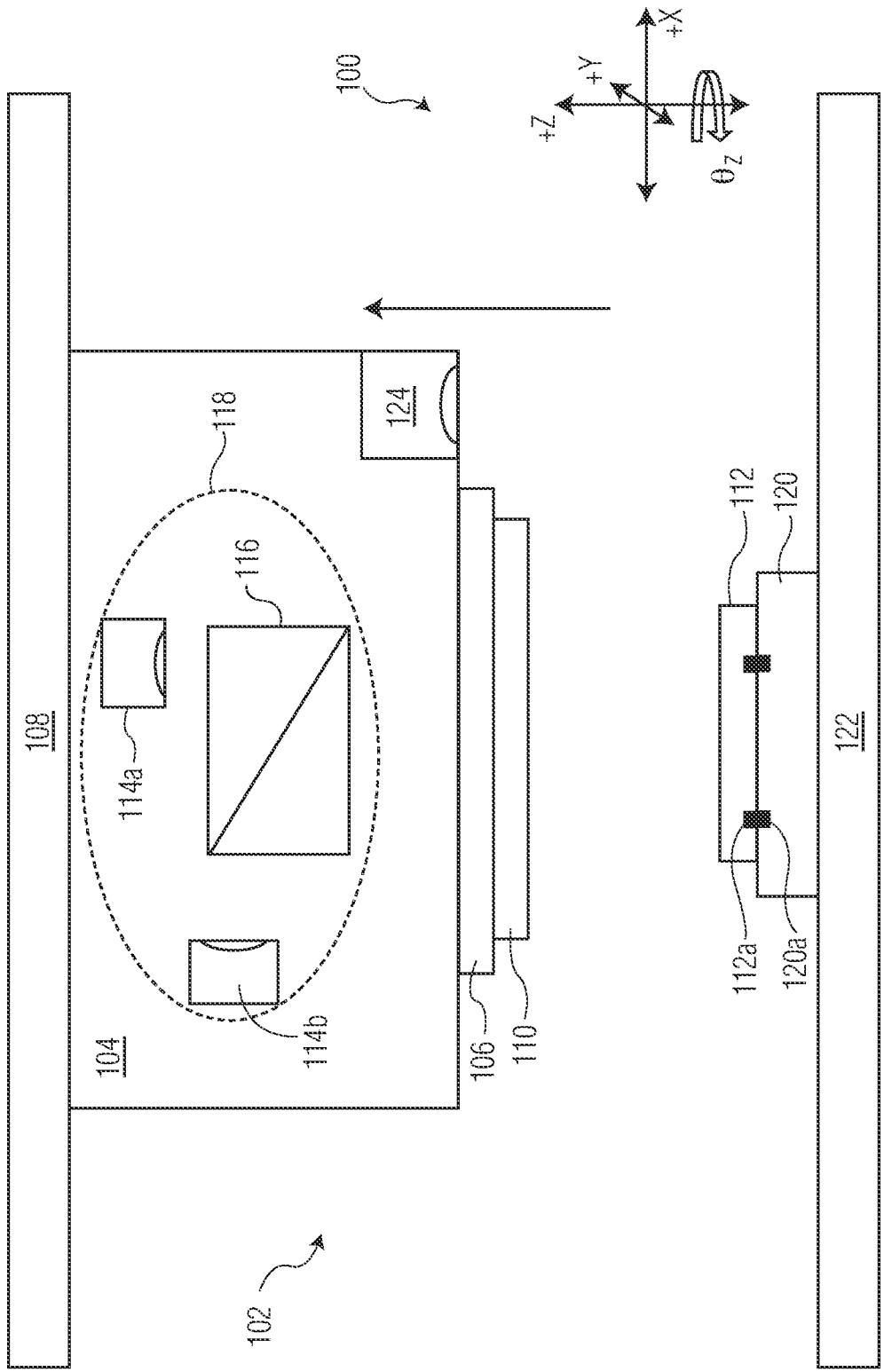

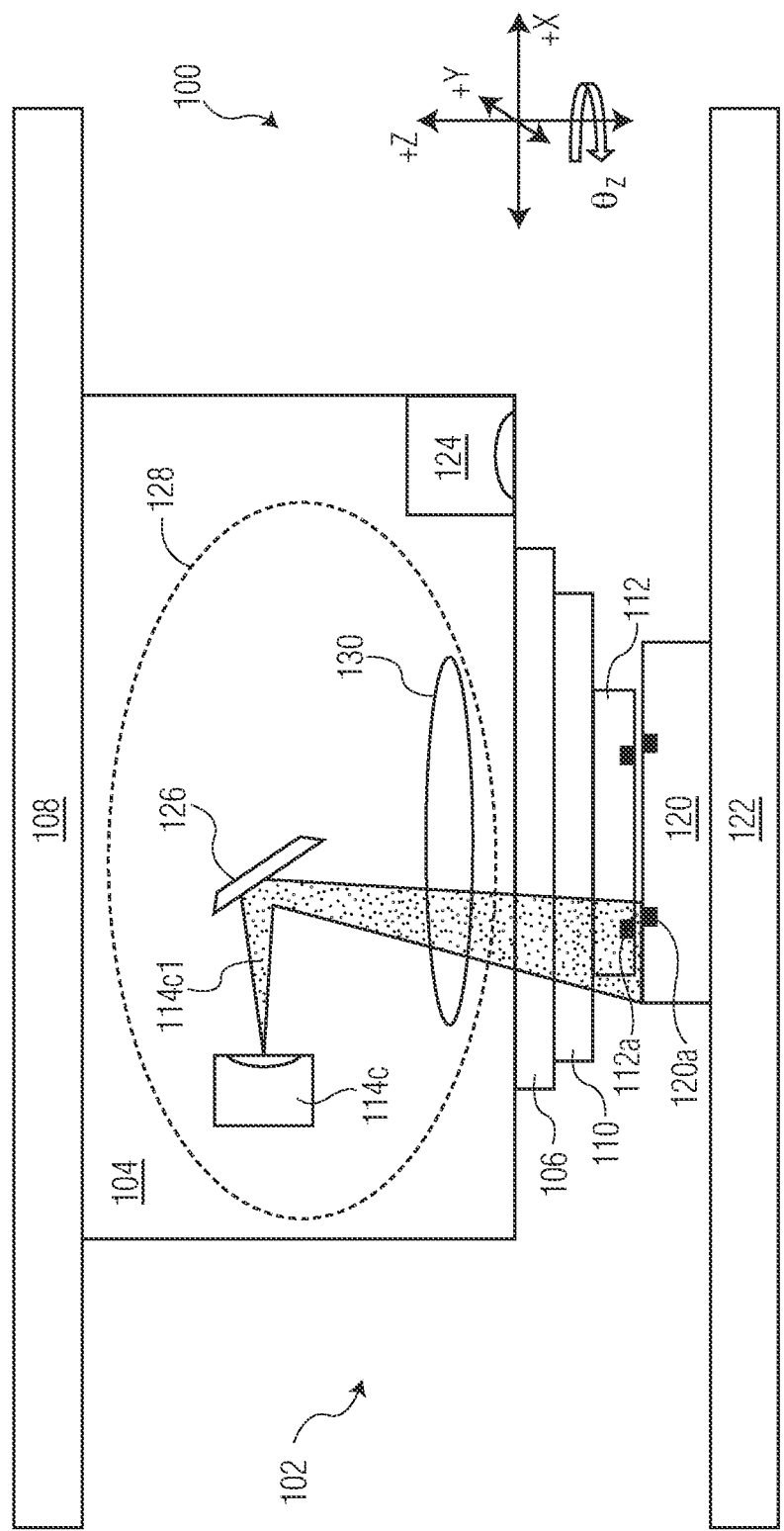

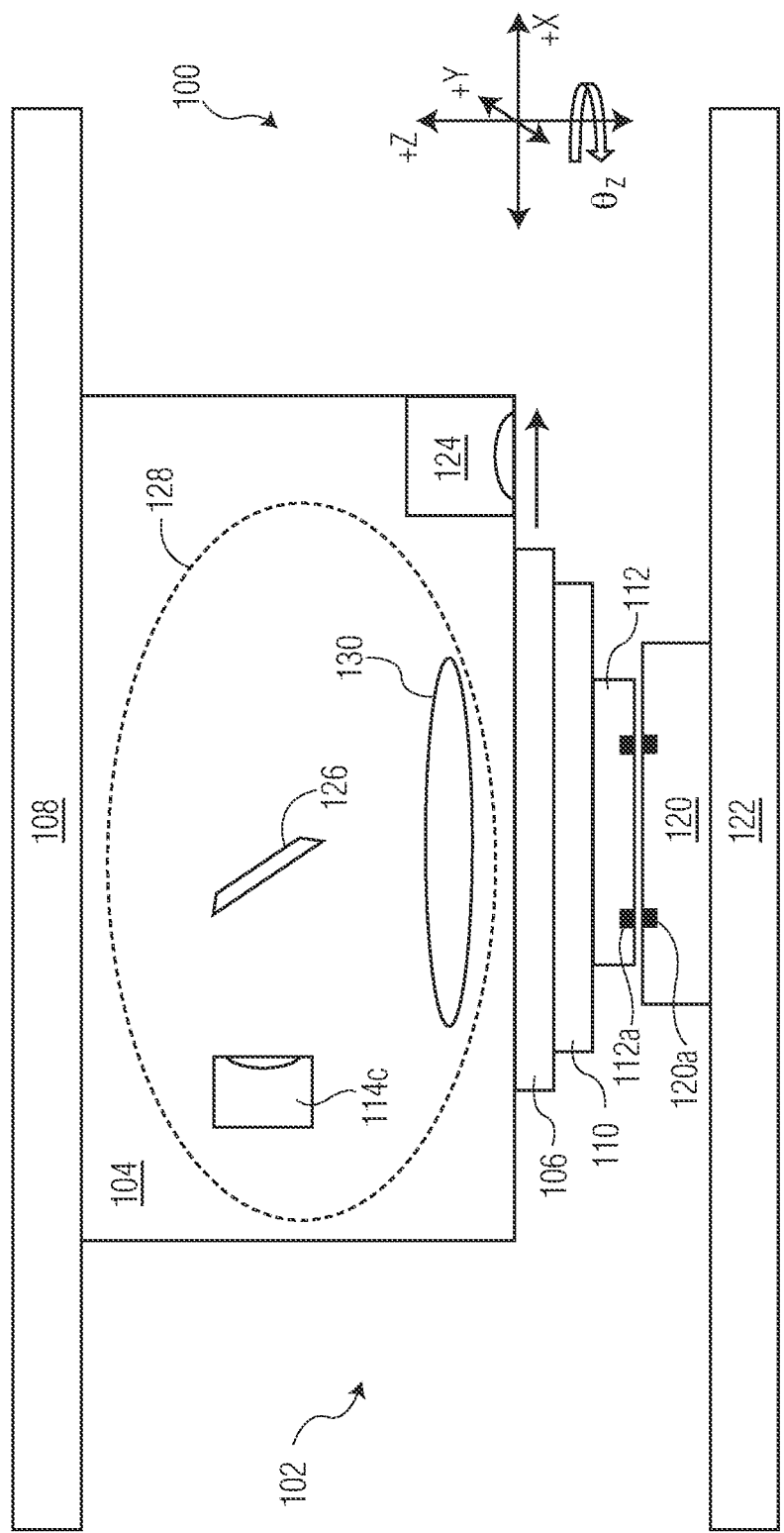

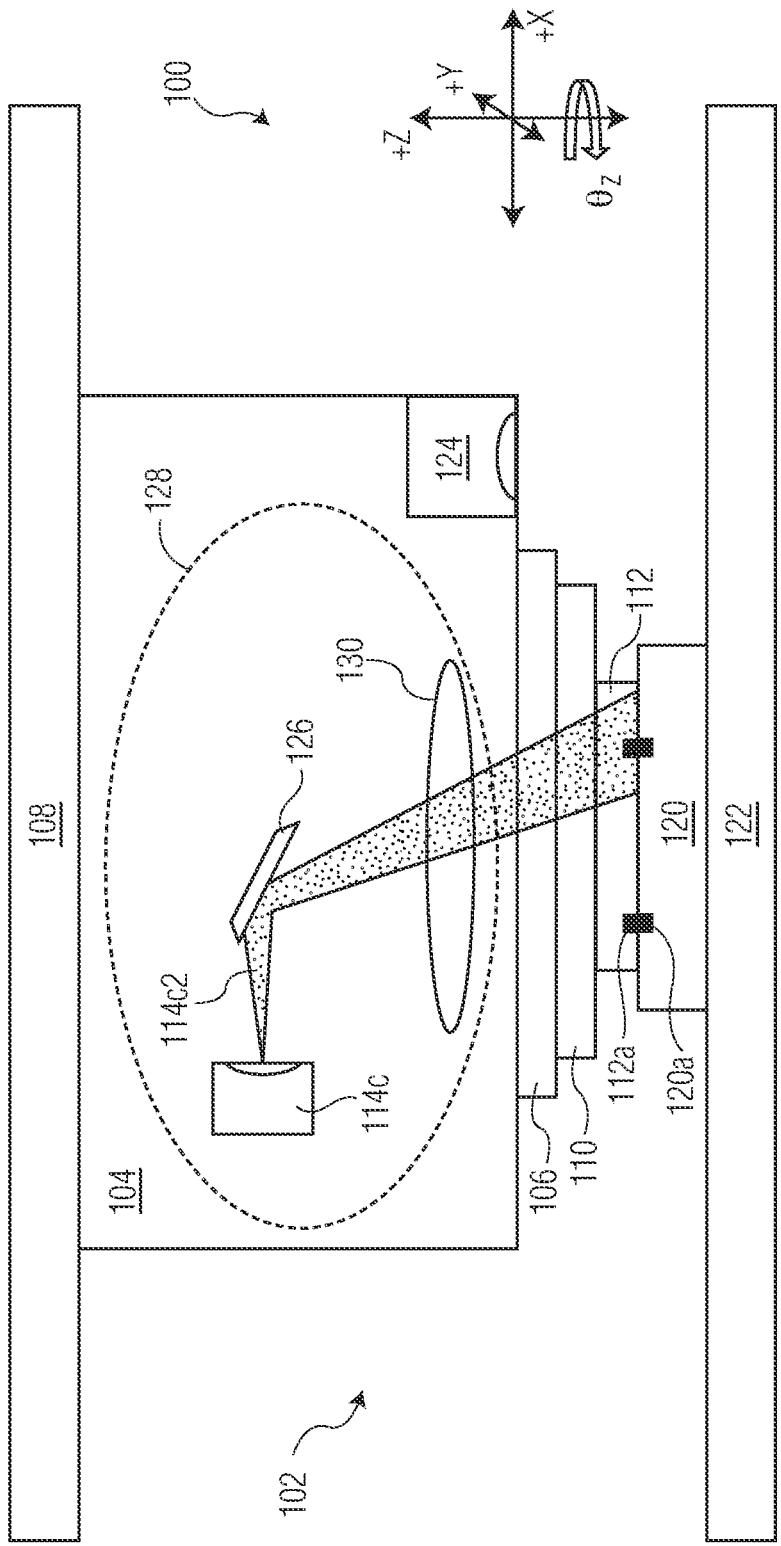

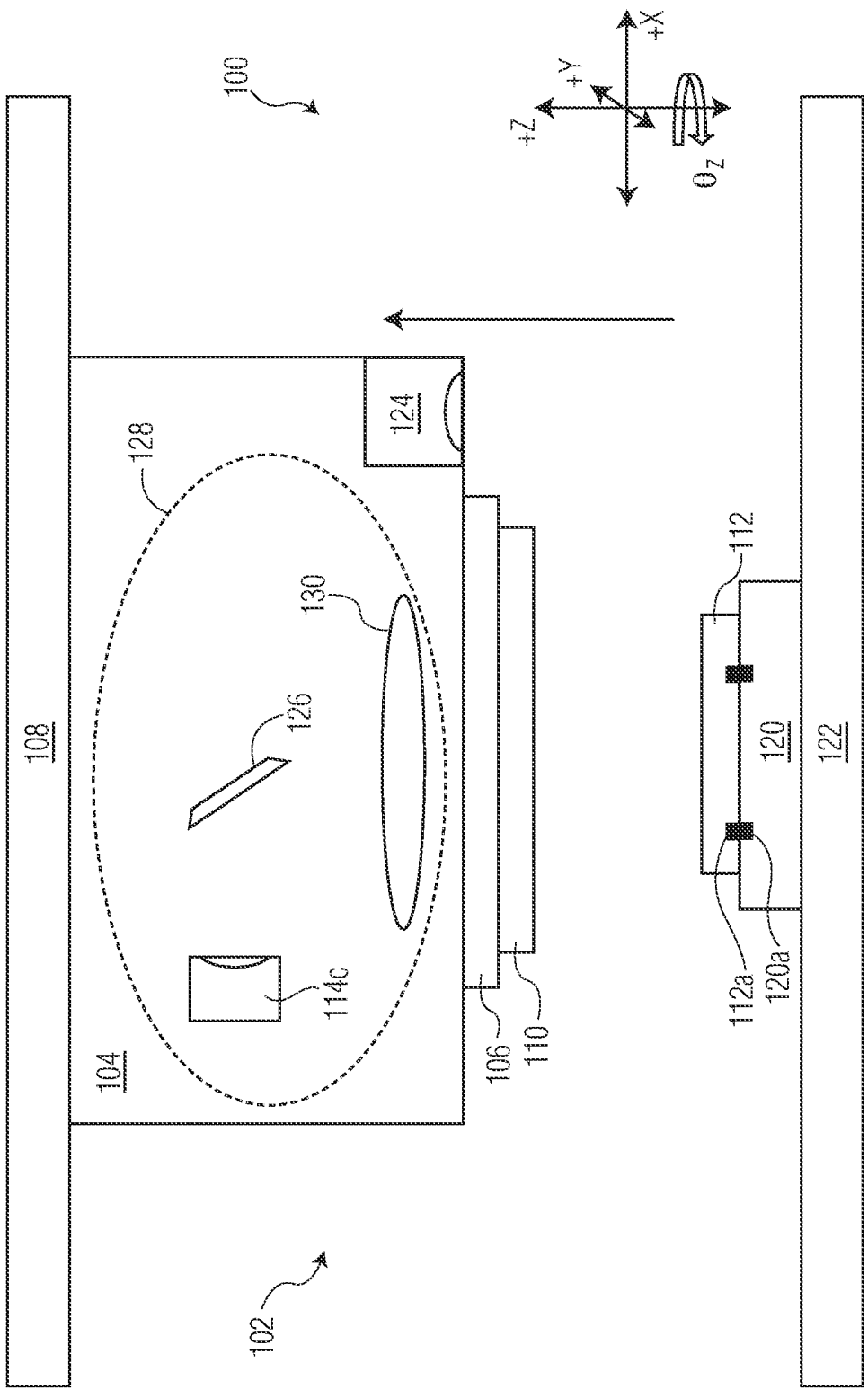

DIE BONDING SYSTEMS, AND METHODS OF USING THE SAME

CROSS-REFERENCE TO RELATED APPLICATION

This application claims the benefit of U.S. Provisional Application No. 63/281,948, filed on Nov. 22, 2021, the content of which is incorporated herein by reference.

FIELD

The invention relates to die bonding systems, and more particularly, to imaging systems for die bonding systems, and related methods.

BACKGROUND

Flip chip bonding is a well known form of die bonding (also referred to as die attach). Due to trends of decreasing interconnect pitch, flip chip applications continuously target improved placement accuracy.

Hybrid bonding is an emerging advanced packaging technology, utilizing flip chip bonding. Exemplary placement accuracy specifications in hybrid bonding are currently as low as 0.2 µm at 3σ. Typical the handling techniques, and alignment techniques, in conventional flip chip bonding schemes do not allow for that level of accuracy.

Thus, it would be desirable to provide improved die bonding systems, and methods of using such die bonding systems, to overcome deficiencies in conventional die bonding systems.

SUMMARY

According to an exemplary embodiment of the invention, a die bonding system is provided. The die bonding system includes a bond head assembly for bonding a die to a substrate. The die includes a first plurality of fiducial markings, and the substrate includes a second plurality of fiducial markings. The die bonding system also includes an imaging system configured for simultaneously imaging one of the first plurality of fiducial markings and one of the second plurality of fiducial markings along a first optical path while the die is carried by the bond head assembly. The imaging system is also configured for simultaneously imaging another of the first plurality of fiducial markings and another of the second plurality of fiducial markings along a second optical path while the die is carried by the bond head assembly. Each of the first optical path and the second optical path are independently configurable to image any area of the die including one of the first plurality of fiducial markings.

According to another exemplary embodiment of the invention, another die bonding system is provided. The die bonding system includes a bond head assembly for bonding a die to a substrate. The die includes a first plurality of fiducial markings, and the substrate includes a second plurality of fiducial markings. The die bonding system also includes an imaging system configured for simultaneously imaging one of the first plurality of fiducial markings and one of the second plurality of fiducial markings along a first optical path while the die is carried by the bond head assembly. The imaging system is also configured for simultaneously imaging another of the first plurality of fiducial markings and another of the second plurality of fiducial markings along a second optical path while the die is carried by the bond head assembly. The imaging system includes a camera and a scanning mirror. The scanning mirror is configured to alternately provide for imaging of (a) the one of the first plurality of fiducial markings and the one of the second plurality of fiducial markings along the first optical path, and (b) the another of the first plurality of fiducial markings and the another of the second plurality of fiducial markings along the second optical path.

According to yet another exemplary embodiment of the invention, yet another die bonding system is provided. The die bonding system includes a bond head assembly for bonding a die to a substrate. The die includes a first plurality of fiducial markings, and the substrate includes a second plurality of fiducial markings. The die bonding system also includes an imaging system configured for simultaneously imaging one of the first plurality of fiducial markings and one of the second plurality of fiducial markings along a first optical path while the die is carried by the bond head assembly. The imaging system is also configured for simultaneously imaging another of the first plurality of fiducial markings and another of the second plurality of fiducial markings along a second optical path while the die is carried by the bond head assembly. The imaging system includes (a) a first camera, (b) a second camera, and (c) an optical element included in each of the first optical path and the second optical path. The first camera images from a first position above the optical element, and the second camera images from a second position along a side of the optical element.

According to yet another exemplary embodiment of the invention, a method of bonding a die to a substrate is provided. The method includes the steps of: (a) simultaneously imaging along a first optical path (i) one of a first plurality of fiducial markings on a die while the die is carried by a bond head assembly, and (ii) one of a second plurality of fiducial markings on a substrate; (b) simultaneously imaging along a second optical path (i) another of the first plurality of fiducial markings on the die while the die is carried by the bond head assembly and (ii) another of the second plurality of fiducial markings on the substrate; (c) adjusting a relative position of the die with respect to the substrate; and (d) bonding the die to the substrate.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 2A-2G are another series of block diagram illustrations of a die bonding system, illustrating a process of bonding a die to a substrate, in accordance with another exemplary embodiment of the invention; and FIGS. 3A-3J are yet another series of block diagram illustrations of a die bonding system, illustrating a process of bonding a die to a substrate, in accordance with an exemplary embodiment of the invention.

DETAILED DESCRIPTION

Figure 1A:
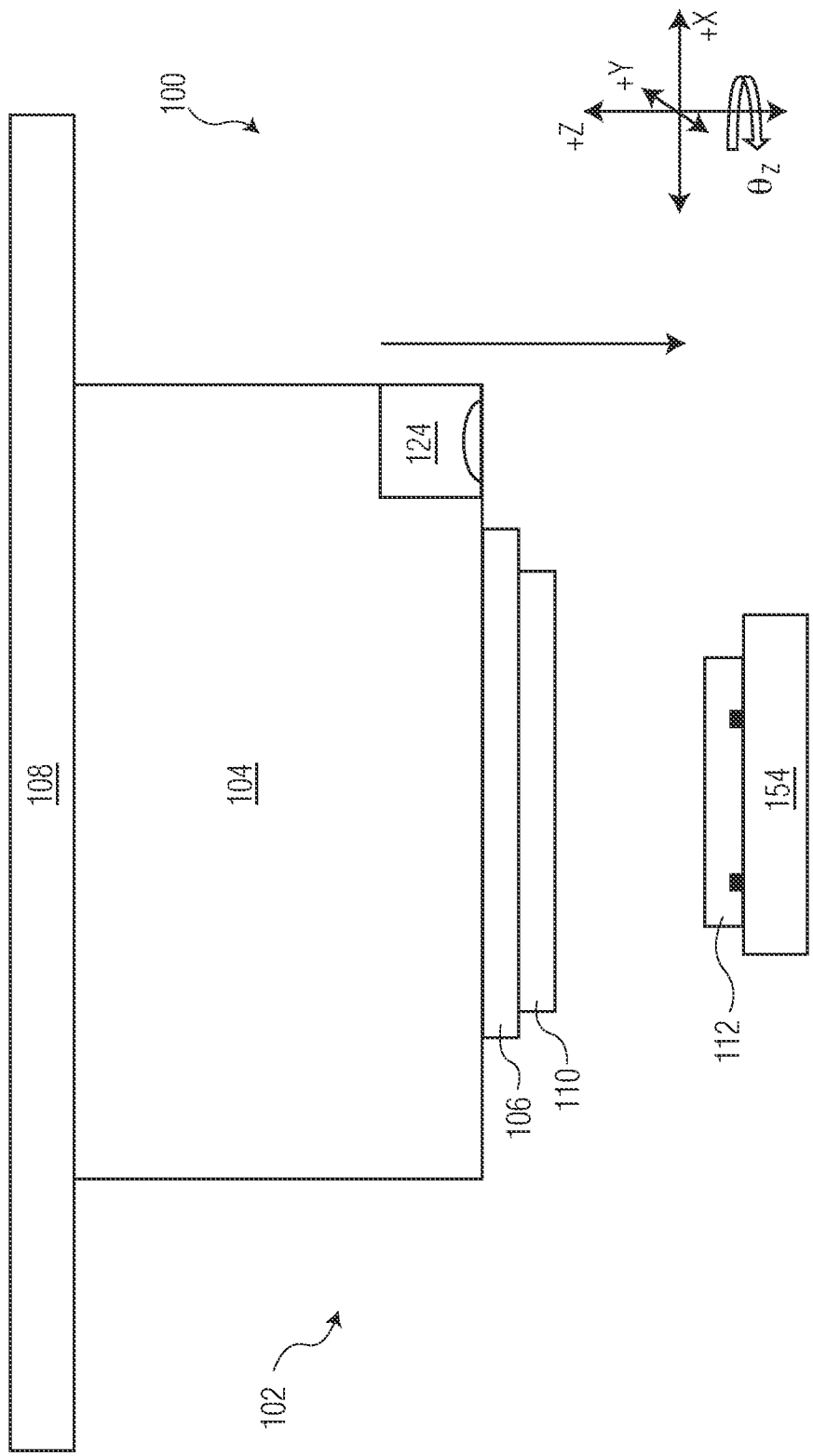
FIGS. 1A-1K are a series of block diagram illustrations of a die bonding system, illustrating a process of bonding a die to a substrate, in accordance with an exemplary embodiment of the invention.

As used herein, the term "die" shall refer to any type of element including (or configured to include) a semiconductor die such as a bare semiconductor die, a packaged die, a plurality of die, etc. As used herein, the term "substrate" shall refer to any type of substrate configured to receive a die in a die bonding operation such as a wafer, another die, a semiconductor element, a panel, a leadframe, or any other type of substrate.

As used herein, the term "die bonding" refers any type of bonding (or attach) of a die to another structure (e.g., a substrate). For example, die bonding includes traditional die bonding (die attach), thermocompression bonding, flip chip bonding, pick and place bonding, hybrid bonding, etc.

Aspects of the invention relate to in situ alignment schemes on die bonding systems. More specifically, aspects of the invention relate to imaging (and/or inspecting) fiducial markings on a die and on a substrate at the same time while the die is held by a bond head above the target surface of the substrate.

According to various exemplary embodiments of the invention, an infrared imaging system (such as a near infrared imaging and camera system) (or other type of imaging system) is used to look through the die, thereby capturing fiducial markings of the die and corresponding fiducial markings of the substrate within the same image.

Aspects of the invention relate to using the relative position of a die and a substrate (e.g., retrieved from at least two pairs of die and substrate fiducials) to adjust the die to substrate alignment prior to bonding. In certain embodiments, pairs of die and substrate fiducials are spaced far apart (e.g., in opposite die corners) in order to get the best possible angle information.

In certain embodiments of the invention, in order to achieve sub-micron level pixel and optical resolution, an optical system provides only a small field of view (i.e., FOV). However, as mentioned above, fiducial sets may be spaced quite far apart (i.e., relative to a specific die size). Therefore, according to certain embodiments of the invention, at least two separate optical systems may be utilized. Such optical systems are desirably mechanically "configurable" with respect to the application specific field of view (FOV) locations.

Aspects of the invention allow for completely independent selection of two or more FOV locations within a die area. FIGS. 1A-1K illustrate a generic case that provides for multiple optical paths. According to one exemplary embodiment, two independent optical paths are provided using two different ports of a beam splitter (or other optical element) (e.g., See FIGS. 2A-2G). According to another exemplary embodiment, two independent optical paths are provided using a multi-axis steering mirror (sometimes referred to as a scanning mirror) that allows for multiple FOVs (e.g., See FIGS. 3A-3J).

These exemplary embodiments (e.g., FIGS. 1A-1K, FIGS. 2A-2G, FIGS. 3A-3J, or other embodiments of the invention) may be combined with an infrared transparent bond tool and/or bond tool holder. Such a bond tool (and/or bond tool holder) can allow for XYZ and $\theta_z$ corrections with high precision (e.g., nm level precision) using the relative die to substrate fiducial measurements.

According to aspects of the invention, the die to substrate alignment may be improved by applying the fiducial measurements (and corresponding fine corrections) in an iterative manner.

According to aspects of the invention, fully independent access of two (or more) optical paths is provided to two or more locations over a whole die area.

In accordance with specific embodiments of the invention, a bond head including infrared (or near infrared, NIR) imaging and camera systems are provided, along with an alignment scheme, that allows for fully independent selection of two (or more) FOVs over a whole die area. Using such aspects, a very compact XYZ and $\theta_z$ fine correction mechanism (e.g., fine motion system 106) is provided that acts right at the bond tool and/or bond tool holder.

Exemplary coarse motion systems illustrated and described herein may be, for example, gantry type motion systems. Exemplary fine motion systems illustrated and described herein may be, for example, piezo actuators (e.g., with nm level resolution). Such fine motion systems may provide, for example, a range of up to 50 µm-100 µm of travel (although fine motion systems with greater than 100 µm of travel may be used in connection with the invention). Such fine motion systems may move a die 10 µm-20 µm down to bring the die into contact with a substrate in connection with a bonding step. A specific exemplary fine motion system may include two piezo stacks for XYZ fine positioning and use synchronous piezo motions, where a rotational position (e.g., rotation about the Z-axis, that is $\theta_z$ motion) may be adjusted using differential piezo motions. A fine motion system may include a vacuum interface for holding a bond tool and/or die.

Such a scheme (e.g., using a coarse motion system and a fine motion system) may be used to provide a high level of accuracy (and efficiency). Large motions may be made using the coarse motion system, and then small adjustments may be made with the fine motion system. Further, there may be a small z-axis movement after final alignment to complete the bonding step.

Any of a number of fiducial styles (e.g., cross-shaped, circular, etc.) may be used as is desired in the specific application. Exemplary fiducials may be approximately 50-100 µm in overall width and/or height (although fiducials of <50 µm and >100 µm may be used in connection with the invention).

To provide fiducial alignment data, an imaging system may be used. In certain exemplary embodiments of the invention, a beam splitter may be used (see optical element 116 of FIG. 2A); however, other optical elements are contemplated. In such embodiments (e.g., including a beam splitter), cameras may move along at least two axes to adapt between different fiducial positions. Cameras move along beam axes to compensate for a shift of optical path length. The beam splitter in the bond head transmits beams through the die, whereby the working distance may remain the same independent of the fiducial position. The fields of view (FOV) may be overlapping. Two independent optical paths (in connection with two beam splitter ports) may be used. Each optical path may have, for example, a 1×1 mm FOV. The camera (e.g., an infrared camera) may be motorized for XY FOV positioning, including overlapping FOVs for large or small dies.

Figure 3A:
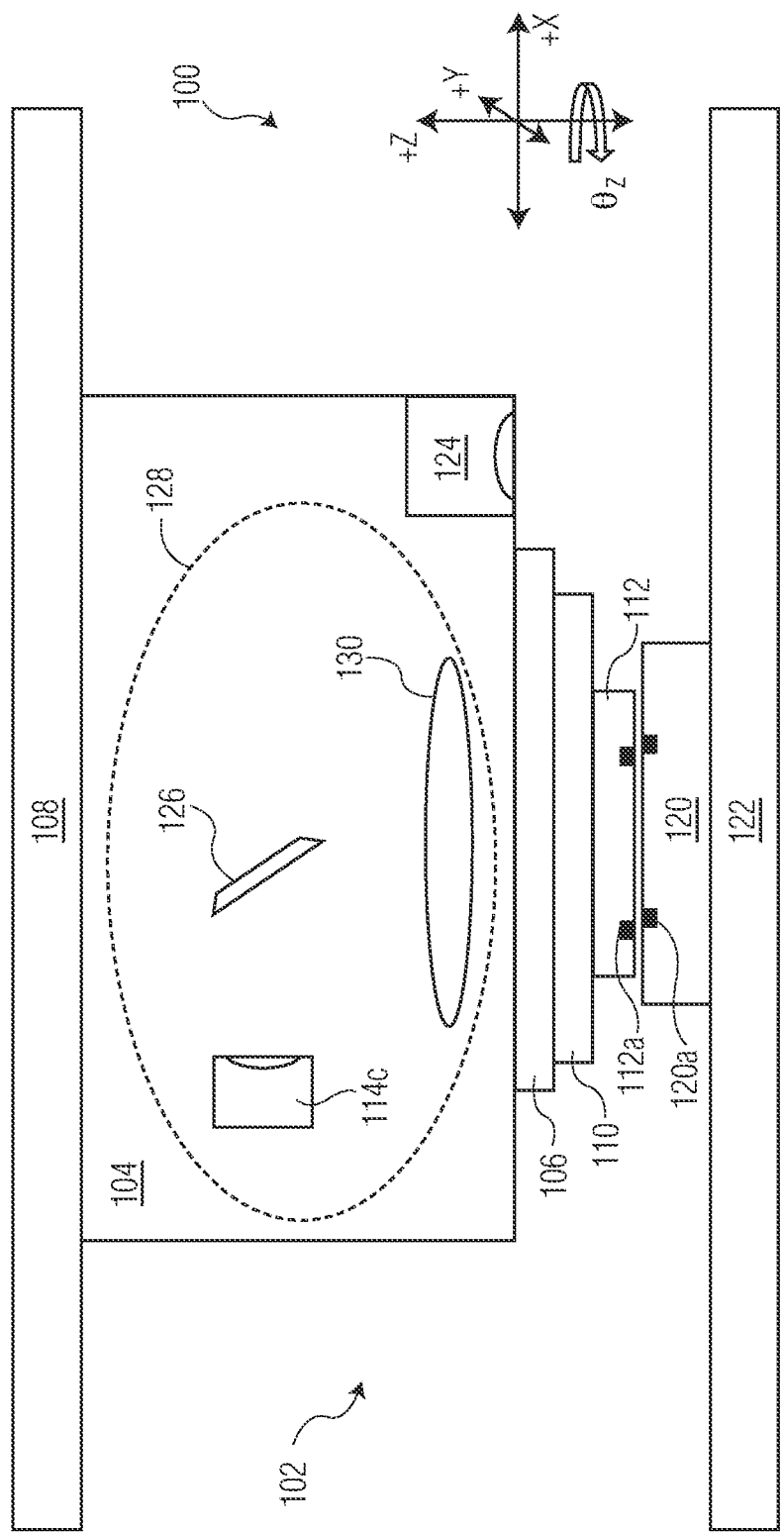

In certain exemplary embodiments of the invention, a scanning mirror (sometimes referred to as a steering mirror) may be used (see mirror 126 of FIG. 3A). Such an embodiment may utilize a simple mechatronics setup and a simple bond tool. A single camera may be utilized with a tilting mirror. The mirror adjusts the camera path between the two fiducials for alignment (e.g., in a sequential measurement). In such embodiments, large lenses may desirably be used to ensure that beams are perpendicular to the bond tool plane.

Figure 1B:
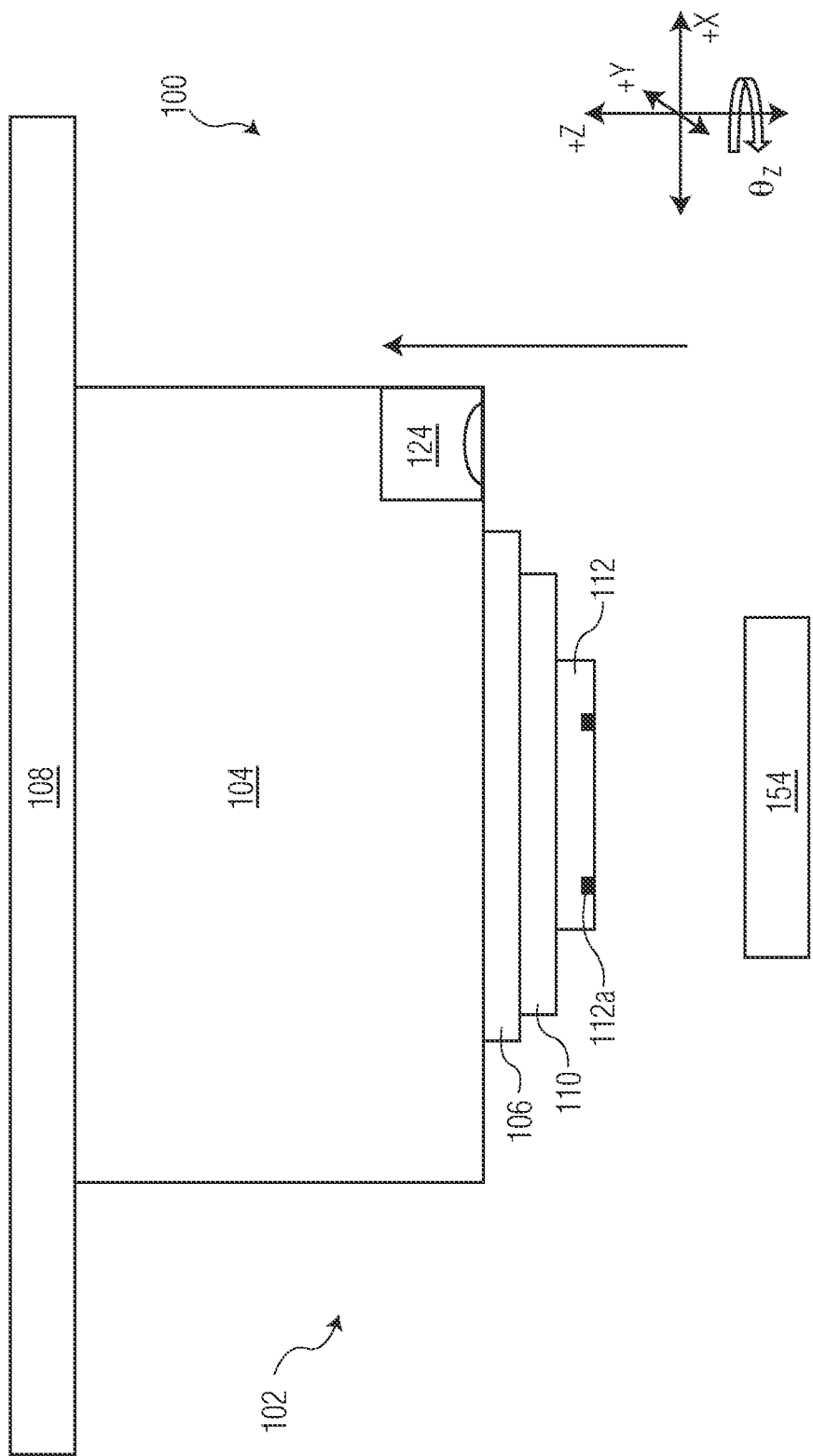

Referring now to FIG. 1A, a die bonding system 100 (e.g., a hybrid bonding system) is illustrated. Die bonding system 100 includes (a) bond head assembly 102 for bonding a die 112 to a substrate, and (b) an imaging system (not illustrated in FIG. 1A) carried by bond head assembly 102. Bond head assembly 102 includes a bond head 104, a fine motion system 106, a bond tool 110, and a camera 124. Bond tool 110 is for holding a die 112 prior to bonding of die 112 to a substrate (where the bond tool holds die 112 at a holding portion of the bond tool, where the holding portion may be formed from an infrared transparent material). Bond head assembly 102 is supported and carried by coarse motion system 108 (e.g., a gantry). Bond head assembly 102 is illustrated moving downward towards die 112 of a die source 154 (e.g., a wafer, a tape and reel, a tray, or other die source including a plurality of die) (e.g., where die source 154 may also be another tool transferring die 112 to bond tool 110). In FIG. 1B, bond head assembly 102 is illustrated moving upward carrying die 112 from die source 154 (i.e., bond head assembly has "picked" die 112 from die source 154). In this example, die 112 is picked up from die source 154 with an active side of the die facing down; however, die 112 may also be picked up with the active side facing up.

Figure 1D:
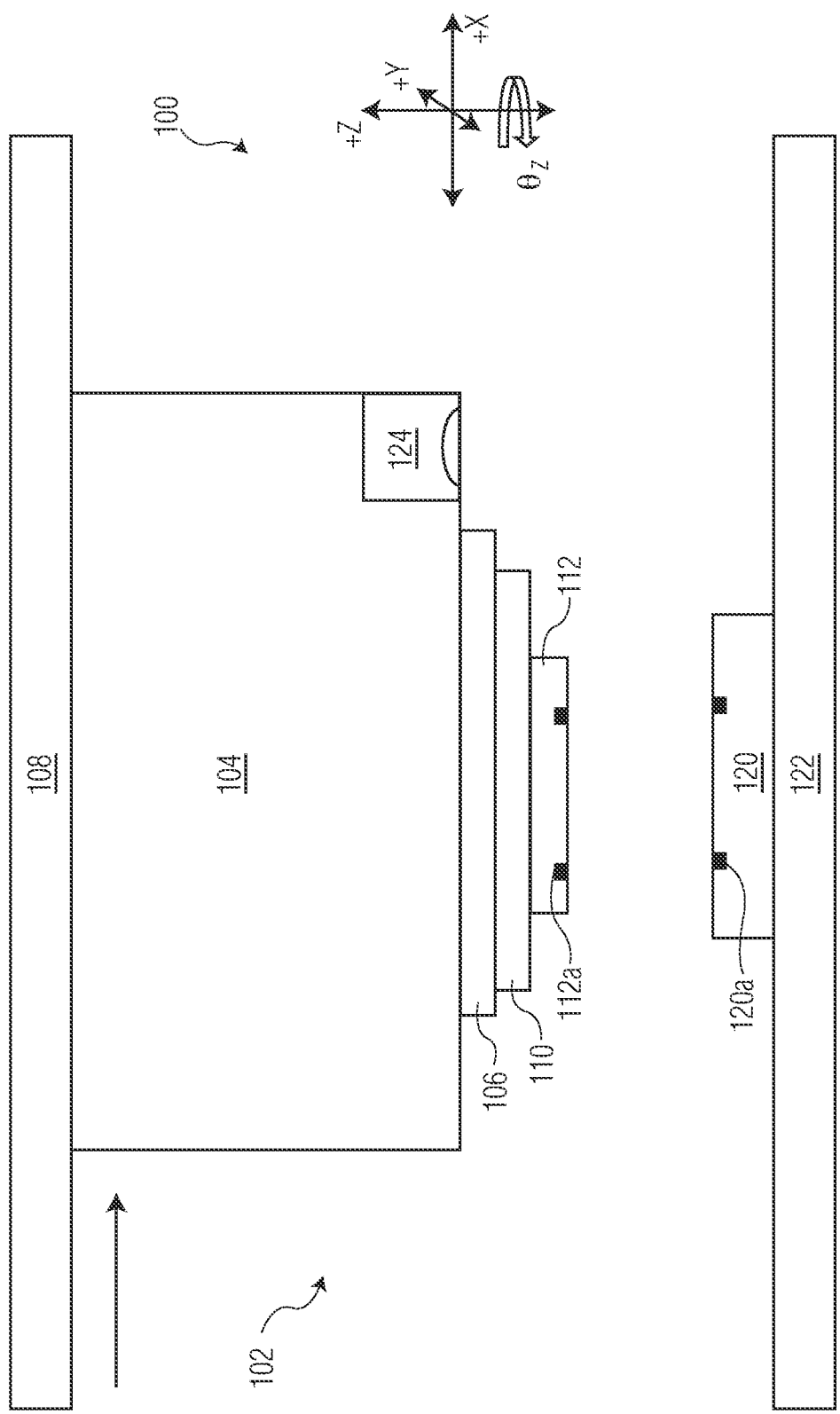
Figure 1E:
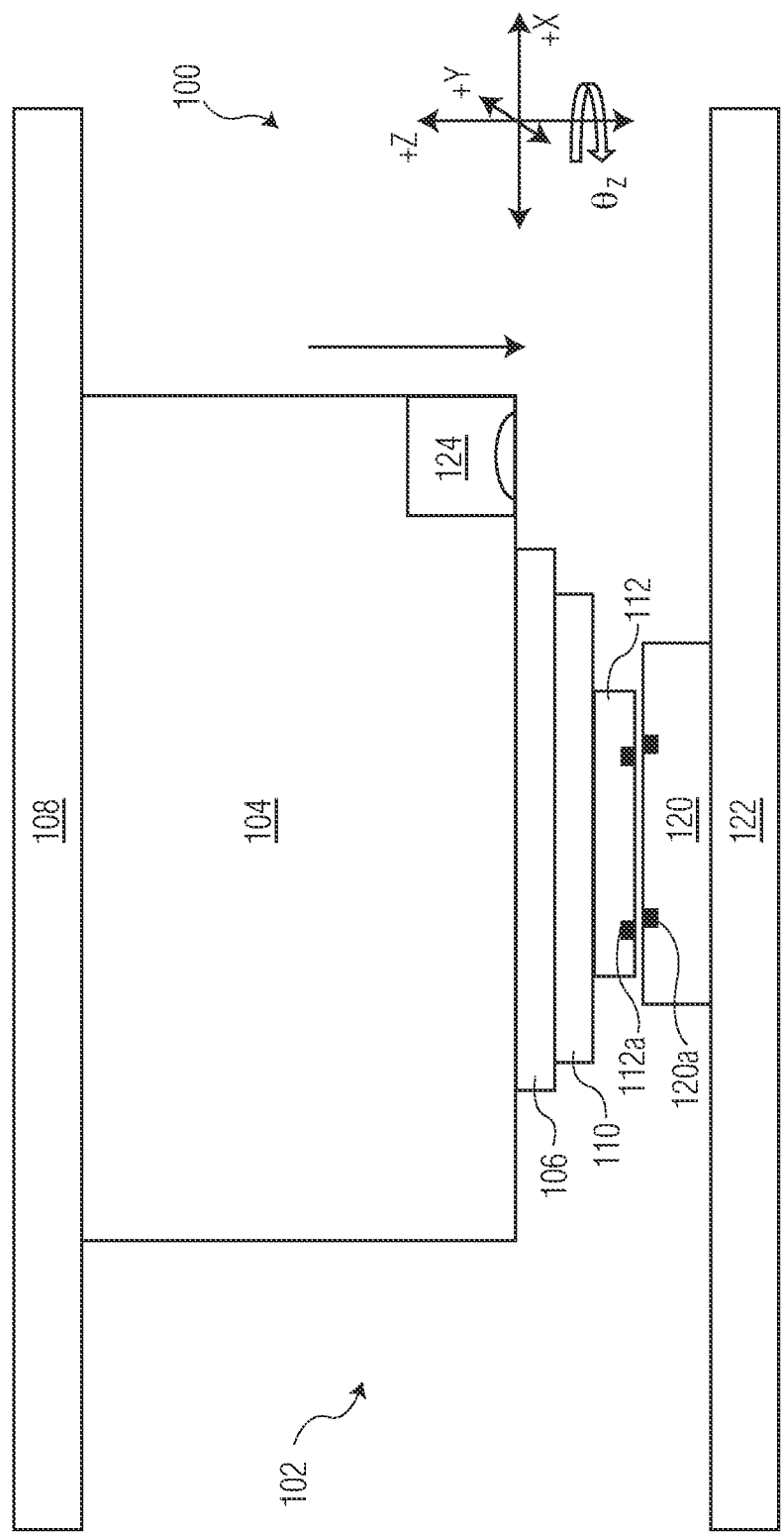
Figure 1G:
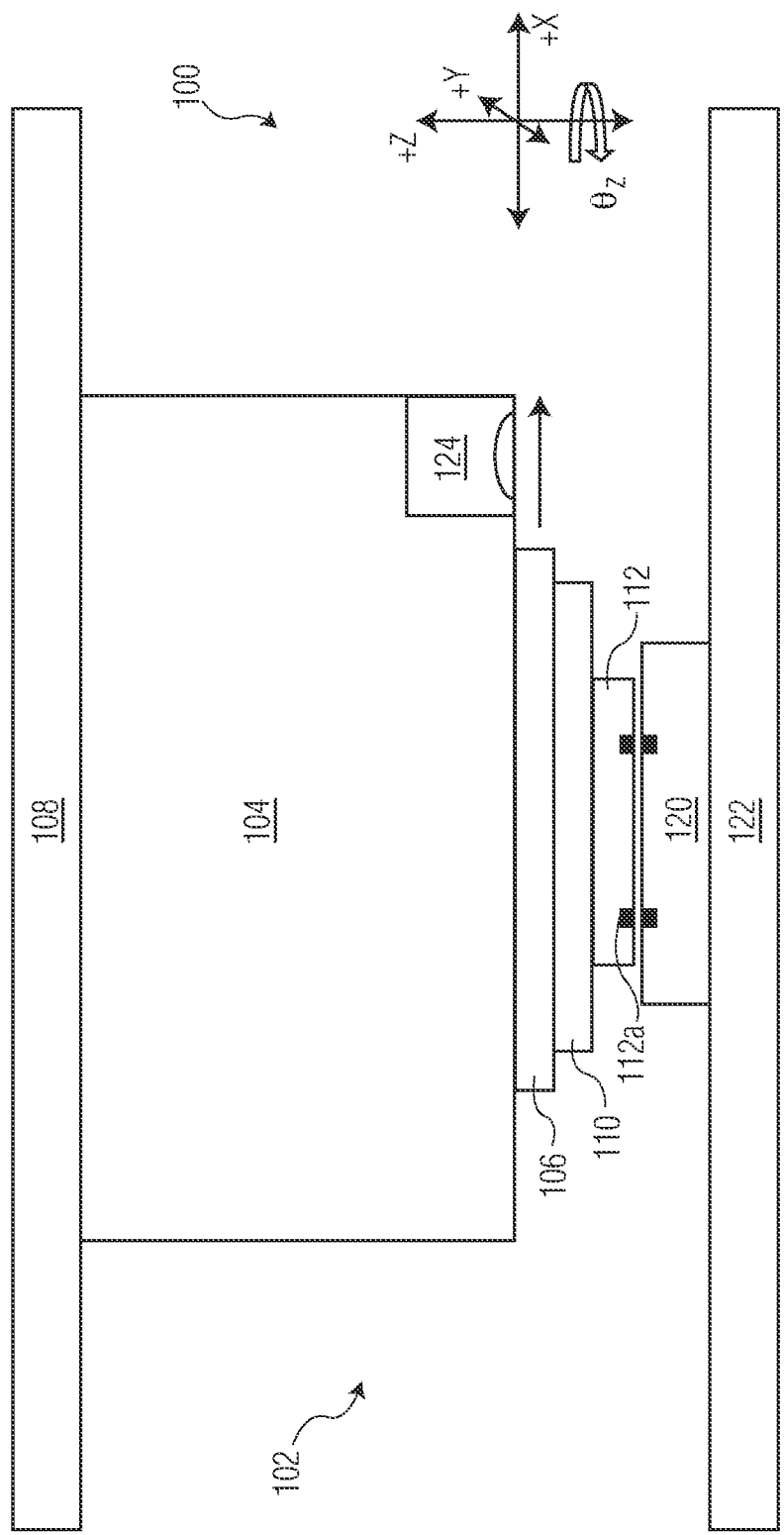

In FIG. 1C, bond head assembly 102 is illustrated using camera 124 (in a downward-looking orientation) in a coarse alignment operation. While camera 124 is illustrated being carried by bond head assembly 102, the camera used for imaging in connection with coarse alignment may be a stationary camera on die bonding system 100. In FIG. 1C, camera 124 is shown in an imaging operation (see optical energy 124a, including light, etc.) to acquire images from a plurality of fiducial markings 120a of substrate 120 (supported by support structure 122) in connection with a coarse alignment scheme (e.g., using coarse motion system 108) (see, e.g., FIGS. 1D-1E). In FIG. 1D, bond head assembly 102 (and/or substrate 120) has been moved such that the plurality of fiducial markings 112a of die 112 are coarsely aligned (e.g., along the X-axis, along the Y-axis, along the Z-axis, and/or about the $\theta_z$ axis) with the plurality of fiducial markings 120a of substrate 120. In FIG. 1E, bond head assembly 102 (and/or substrate 120) has been moved (e.g., along the Z-axis) such that die 112 is close to substrate 120. In FIG. 1F, an imaging system (identified as element 114x for simplicity) images along a first optical path 114x1 and a second optical path 114x2 (e.g., to image multiple pairs of fiducials 112a/120a). The relative die to substrate measurement from the imaging at FIG. 1F is then used to calculate corrections (e.g., corrections along the X-axis, along the Y-axis, along the Z-axis, and/or about the $\theta_z$ axis) in order to achieve "closer" alignment. In FIG. 1G, fine motion system 106 adjusts die 112 (e.g., along the X-axis, along the Y-axis, along the Z-axis, and/or about the $\theta_z$ axis) according to such corrections, such that the plurality of fiducial markings 112a of die 112 are more closely aligned with the plurality of fiducial markings 120a of substrate 120 in preparation for a subsequent bonding step. Fine motion system 106 may include piezo actuators with nm resolution.

Figure 1H:
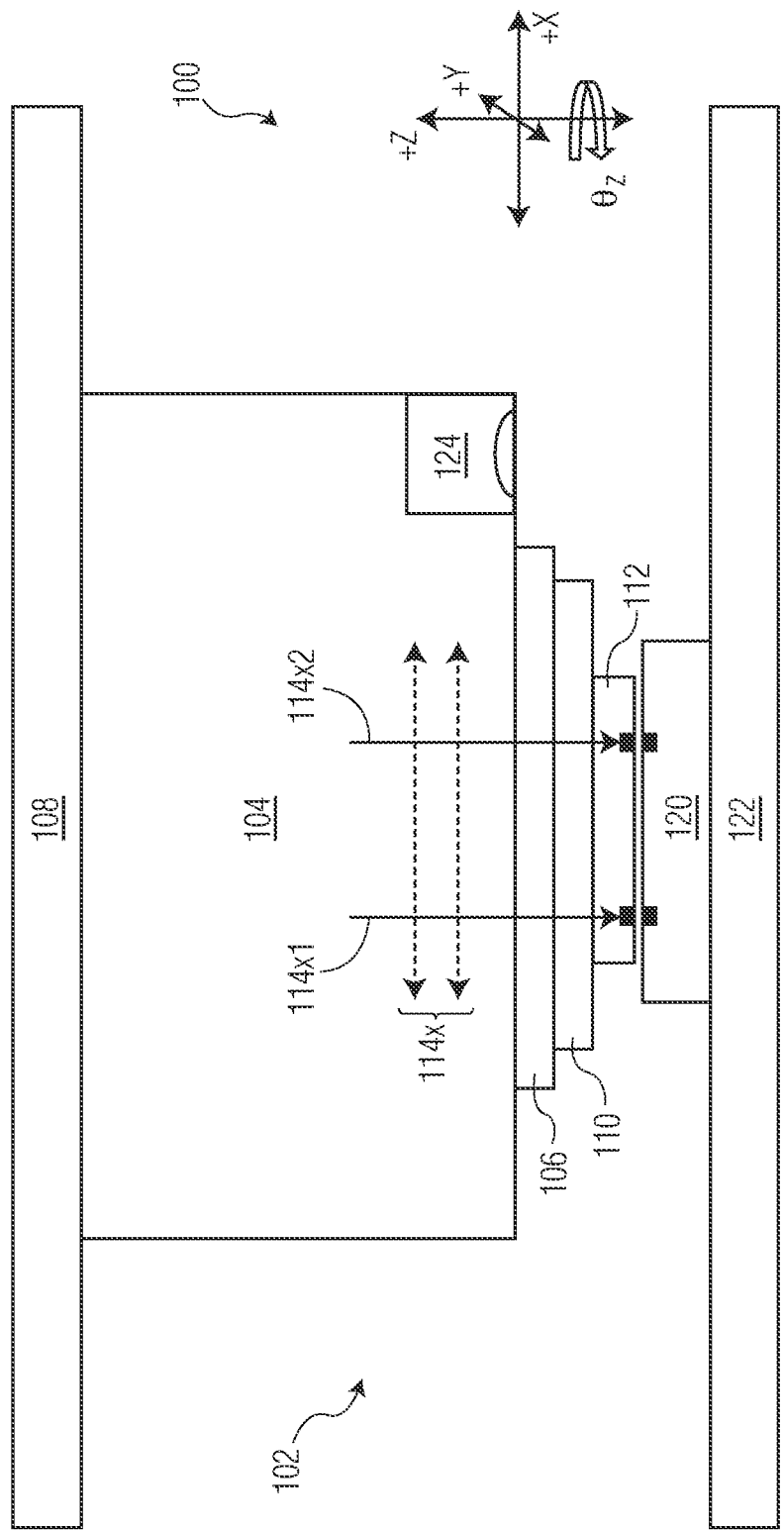
Figure 1T:
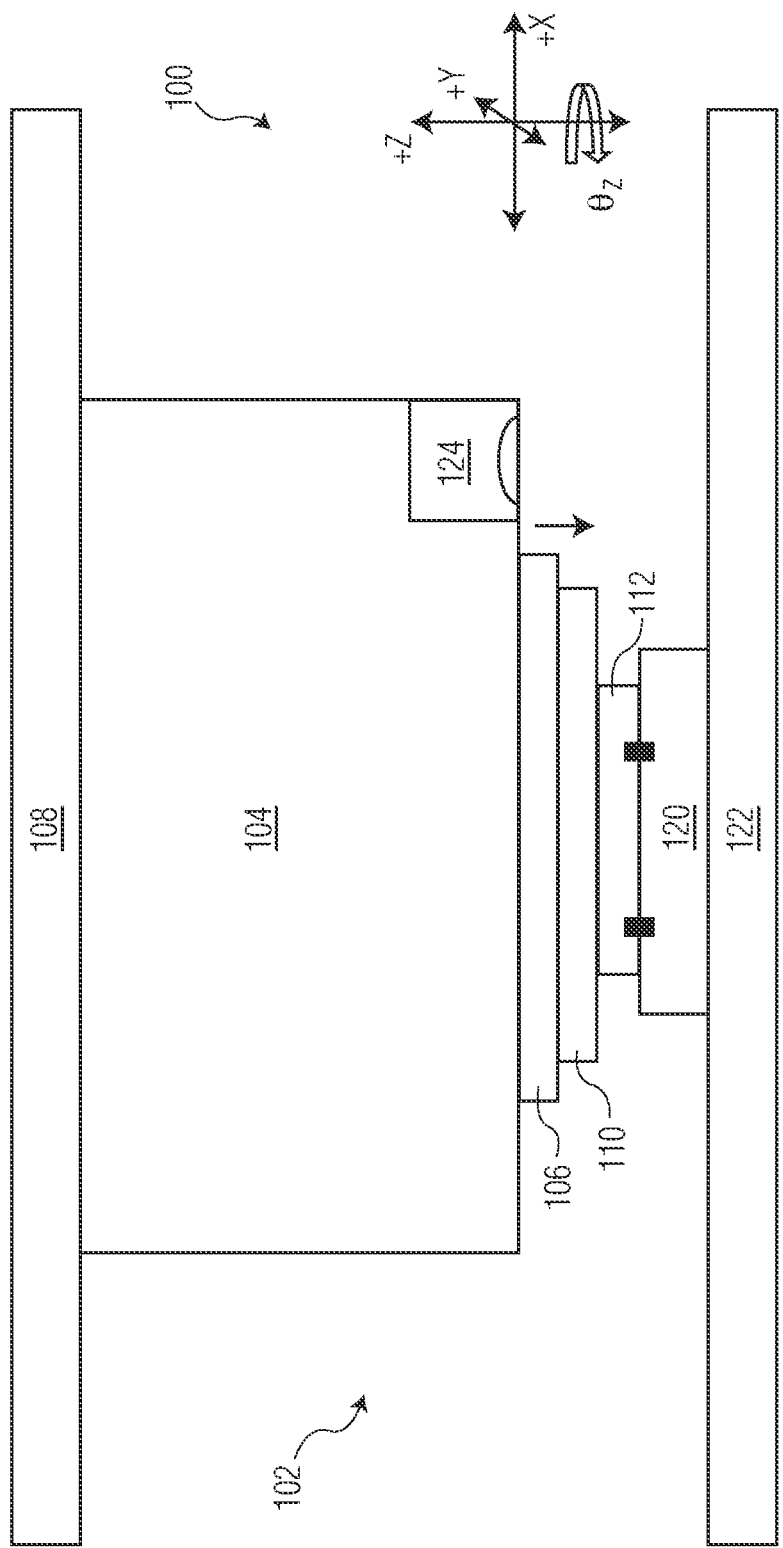

In FIG. 1H, an imaging system (identified as element 114x) images along a first optical path 114x1 and a second optical path 114x2 to ensure alignment prior to a subsequent bonding step. If the alignment detected in FIG. 1H is not satisfactory (e.g., according to some predetermined accuracy criteria), another adjustment(s) (as in FIG. 1G) may be made. If the alignment detected in FIG. 1H is satisfactory (e.g., according to some predetermined accuracy criteria), the process proceeds to FIG. 1I.

Figure 1K:
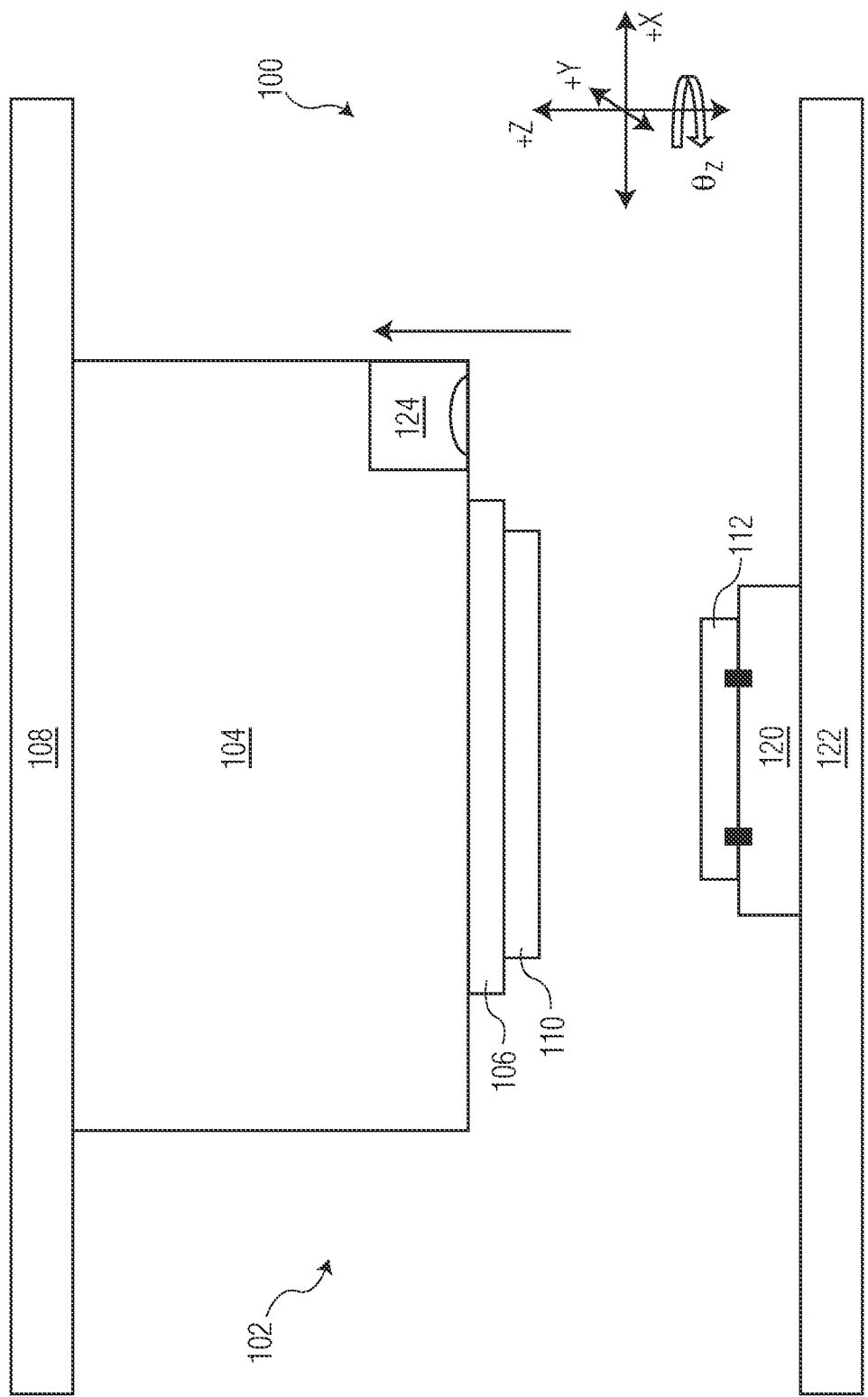

In FIG. 1I, die 112 is moved to contact substrate 120 in connection with a bonding step. This vertical (e.g., along the Z-axis) movement may be, for example, on the order of 10 μm-20 μm. The vertical movement may be, for example, achieved by a Z-axis portion of the fine motion system. Various types of die bonding may be performed (e.g., traditional die bonding, thermocompression bonding, flip chip bonding, pick and place bonding, hybrid bonding, etc.). If the bonding operation is a hybrid bonding operation, a surface contact between the die and the substrate (e.g., where the surfaces may be plasma activated surfaces) already establishes a bond. In FIG. 1J, an imaging system (identified as element 114x) images along a first optical path 114x1 and a second optical path 114x2 to confirm die 112 was bonded in a desired position (i.e., a post place inspection process). In FIG. 1K, after bonding, bond head assembly 102 is moved away from substrate 120 (e.g., after releasing a die vacuum, fine motion system 106 may used to retract bond tool 110 from die 112). Although the post place inspection process is shown in FIG. 1J at the bonding height, it is understood that such a post place inspection can take place at other times and/or positions, for example, at a higher position after bonding is complete (e.g., at the position shown in FIG. 1H).

FIGS. 1A-1K illustrate the use of a generic imaging system 114x. FIGS. 2A-2G and FIGS. 3A-3J are two specific examples of such an imaging system. Thus, the operation of die bonding system 100 described above in connection with FIGS. 1A-1J is applicable to the operation of FIGS. 2A-2G and FIGS. 3A-3J except where described as distinct. Other imaging systems (and related die bonding systems) are contemplated within the scope of the invention. The steps shown in FIGS. 1A-1D (including picking a die, and the coarse adjustment) are omitted from the series of drawings provided in FIGS. 2A-2G and FIGS. 3A-3J.

Figure 2B:
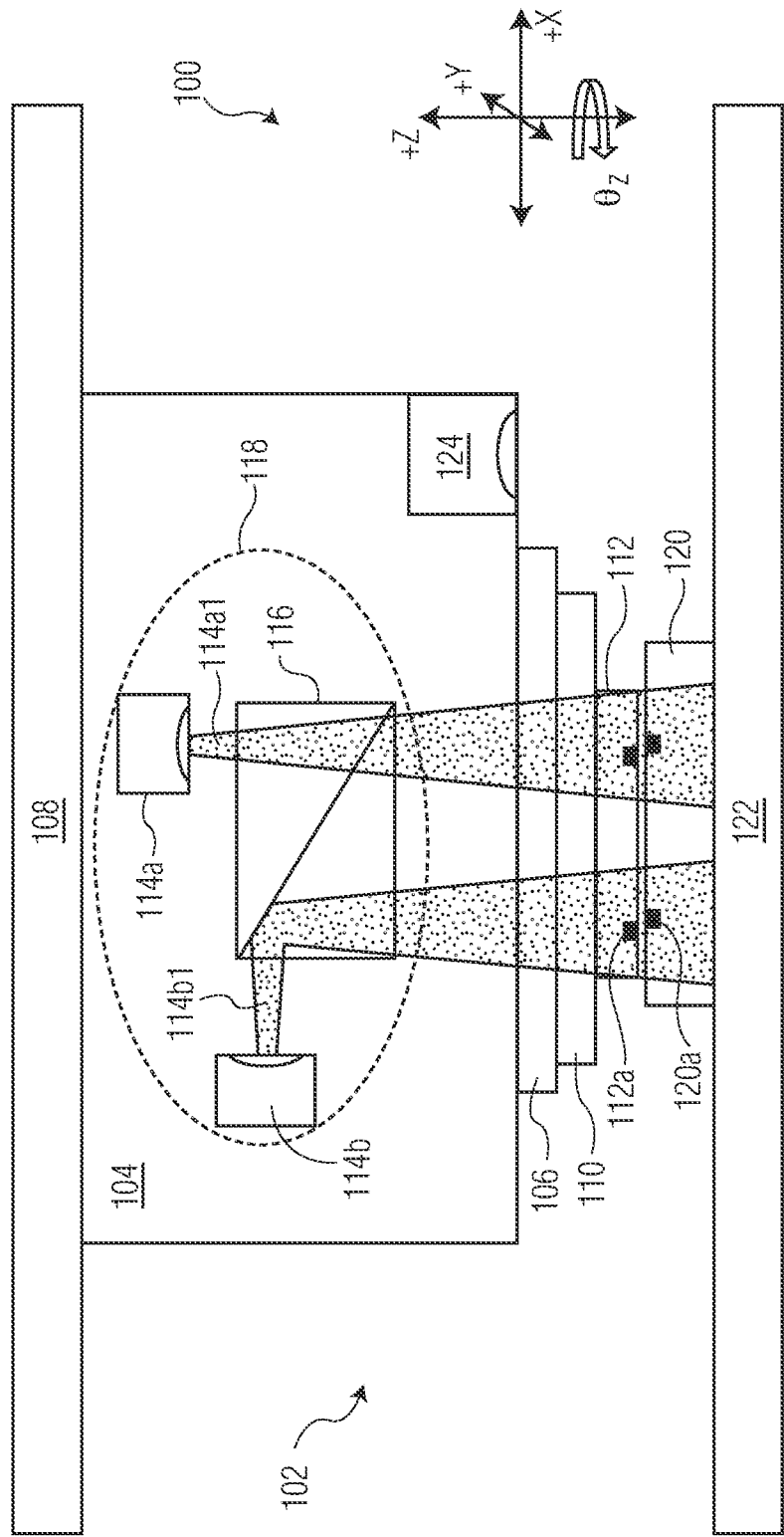

Referring specifically to FIG. 2A, bond head assembly 102 is illustrated having been moved such that the plurality of fiducial markings 112a of die 112 are coarsely aligned (e.g., along the X-axis, along the Y-axis, along the Z-axis, and/or about the $\theta_z$ axis) with the plurality of fiducial markings 120a of substrate 120. Bond head assembly 102 has been moved (e.g., along the Z-axis) such that die 112 is close to substrate 120. Bond head assembly 102 includes imaging system 118, including a first camera 114a, a second camera 114b, and an optical element 116 (e.g., a beam splitter). In FIG. 2B, imaging system 118 images along a first optical path 114a1 and a second optical path 114b1 (e.g., to image multiple pairs of fiducials 112a/120a). In FIG. 2C, fine motion system 106 adjusts die 112 (e.g., along the X-axis, along the Y-axis, and/or about the $\theta_z$ axis) such that the plurality of fiducial markings 112a of die 112 are more closely aligned with the plurality of fiducial markings 120a of substrate 120 in preparation for a subsequent bonding step.

Figure 2D:
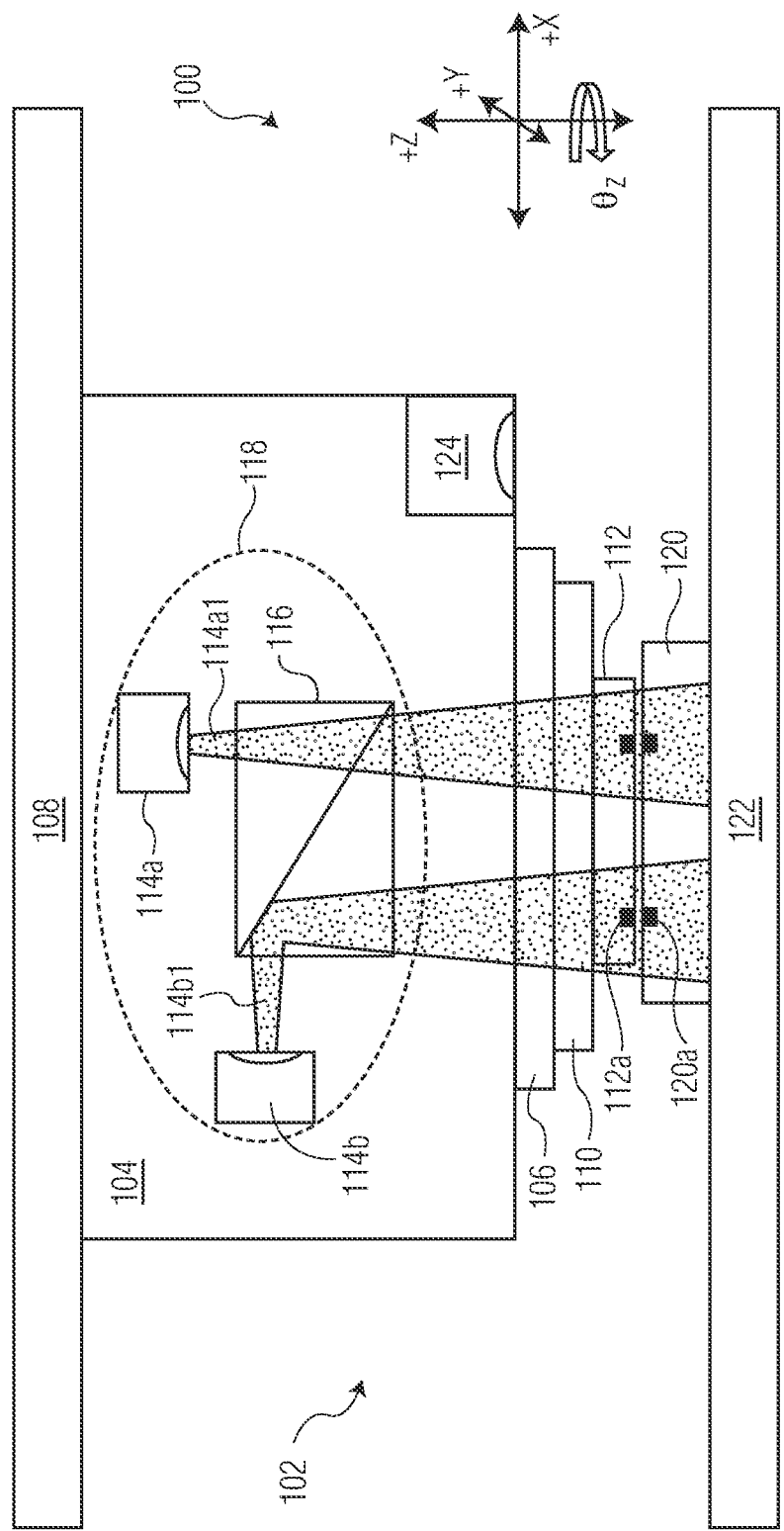
Figure 2F:
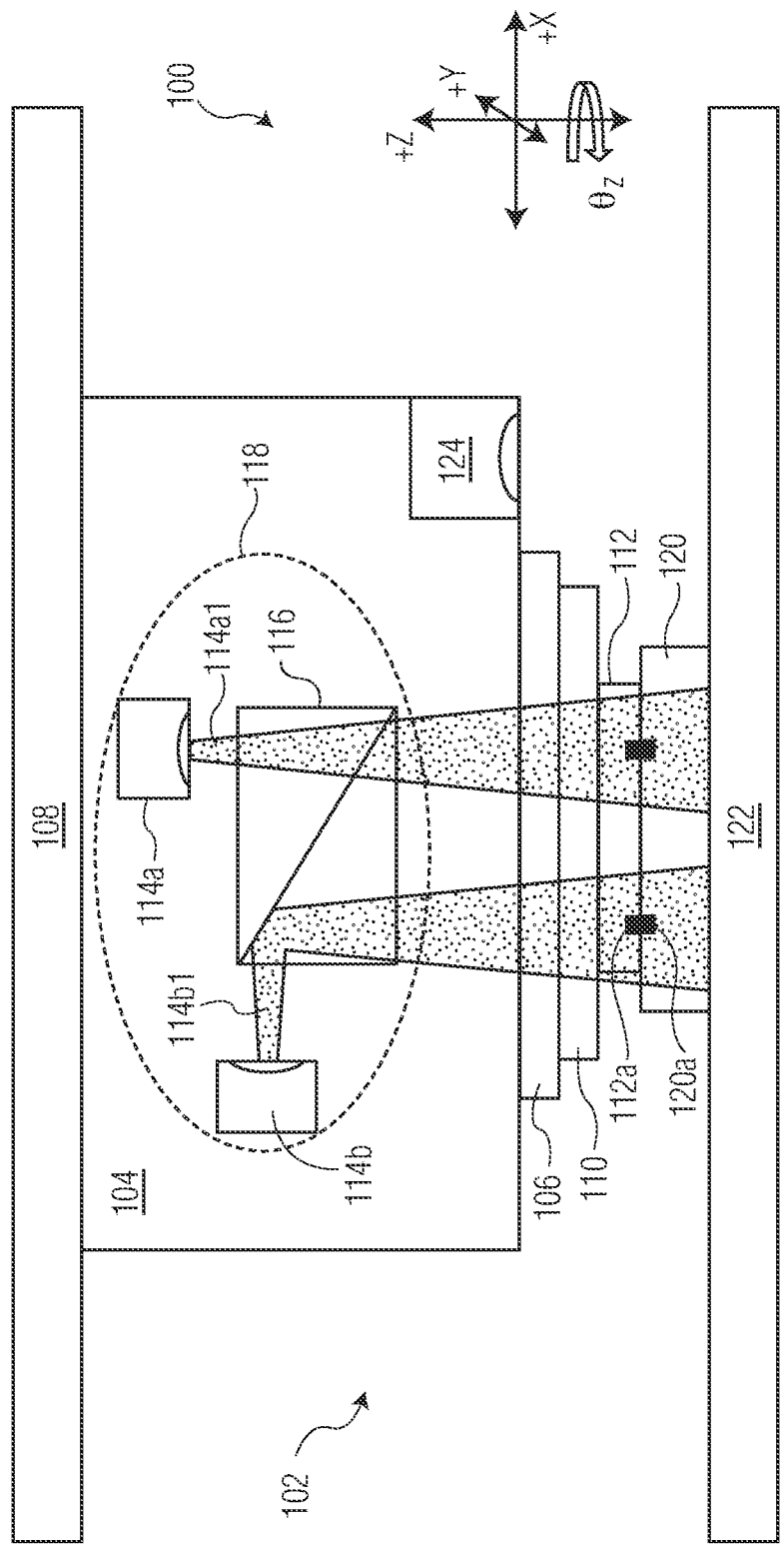

In FIG. 2D, imaging system 118 images along a first optical path 114a1 and a second optical path 114b1 to ensure alignment prior to a subsequent bonding step. If the alignment detected in FIG. 2D is not satisfactory (e.g., according to some predetermined accuracy criteria), another adjustment(s) (as in FIG. 2C) may be made. If the alignment detected in FIG. 2D is satisfactory (e.g., according to some predetermined accuracy criteria), the process proceeds to FIG. 2E. In FIG. 2E, die 112 is moved to contact substrate 120 in connection with a bonding step. Various types of bonding may be performed (e.g., traditional die bonding, thermocompression bonding, flip chip bonding, pick and place bonding, hybrid bonding, etc.). If the bonding operation is a hybrid bonding operation, a surface contact between the die and the substrate (e.g., where the surfaces may be plasma activated surfaces) already establishes a bond. In FIG. 2F, imaging system 118 images along a first optical path 114a1 and a second optical path 114b1 to confirm die 112 was bonded in a desired position (i.e., a post place inspection process). In FIG. 2G, after bonding, bond head assembly 102 is moved away from substrate 120 (e.g., after releasing a die vacuum, fine motion system 106 may used to retract bond tool 110 from die 112). Although the post place inspection process is shown in FIG. 2F at the bonding height, it is understood that such a post place inspection can take place at other times and/or positions, for example, at a higher position after bonding is complete (e.g., at the position shown in FIG. 2D).

Figure 3C:
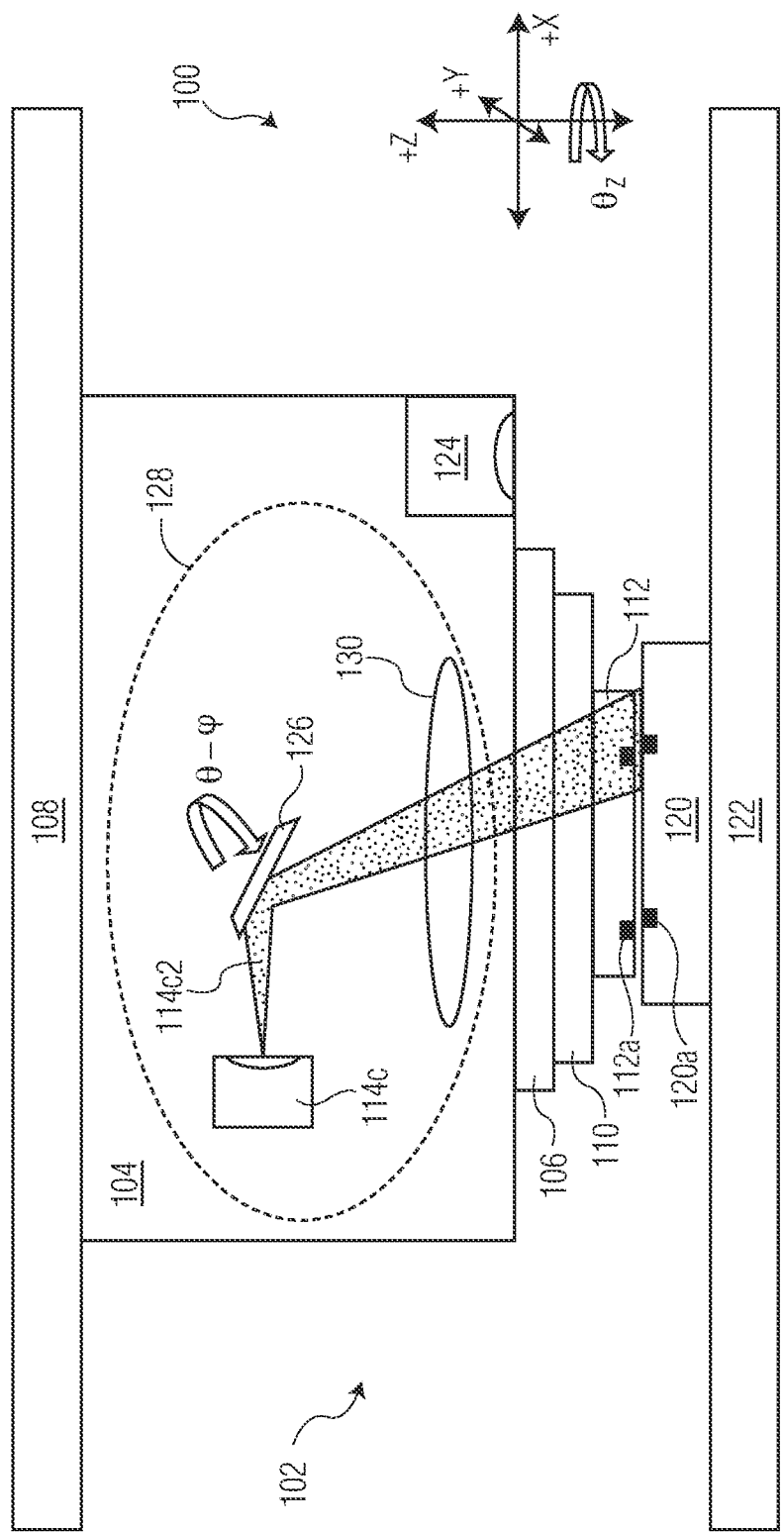

Referring now to FIG. 3A, bond head assembly 102 is illustrated having been moved such that the plurality of fiducial markings 112a of die 112 are coarsely aligned (e.g., along the X-axis, along the Y-axis, along the Z-axis, and/or about the $\theta_z$ axis) with the plurality of fiducial markings 120a of substrate 120. Bond head assembly 102 has been moved (e.g., along the Z-axis) such that die 112 is close to substrate 120. Bond head assembly 102 includes imaging system 128, including a camera 114c, a mirror 126 (e.g., a scanning mirror, a steering mirror, etc.), and an optical element 130. In FIG. 3B, imaging system 128 images along a first optical path 114c1 (e.g., to image a pair of fiducials 112a/120a). In FIG. 3C, imaging system 128 has operated (e.g., tilted, rotated, and/or otherwise adjusted mirror 126) to now image along a second optical path 114c2 (e.g., to image another pair of fiducials 112a/120a). In FIG. 3D, fine motion system 106 adjusts die 112 (e.g., along the X-axis, along the Y-axis, along the Z-axis, and/or about the $\theta_z$ axis) such that the plurality of fiducial markings 112a of die 112 are more closely aligned with the plurality of fiducial markings 120a of substrate 120 in preparation for a subsequent bonding step.

Figure 3E:
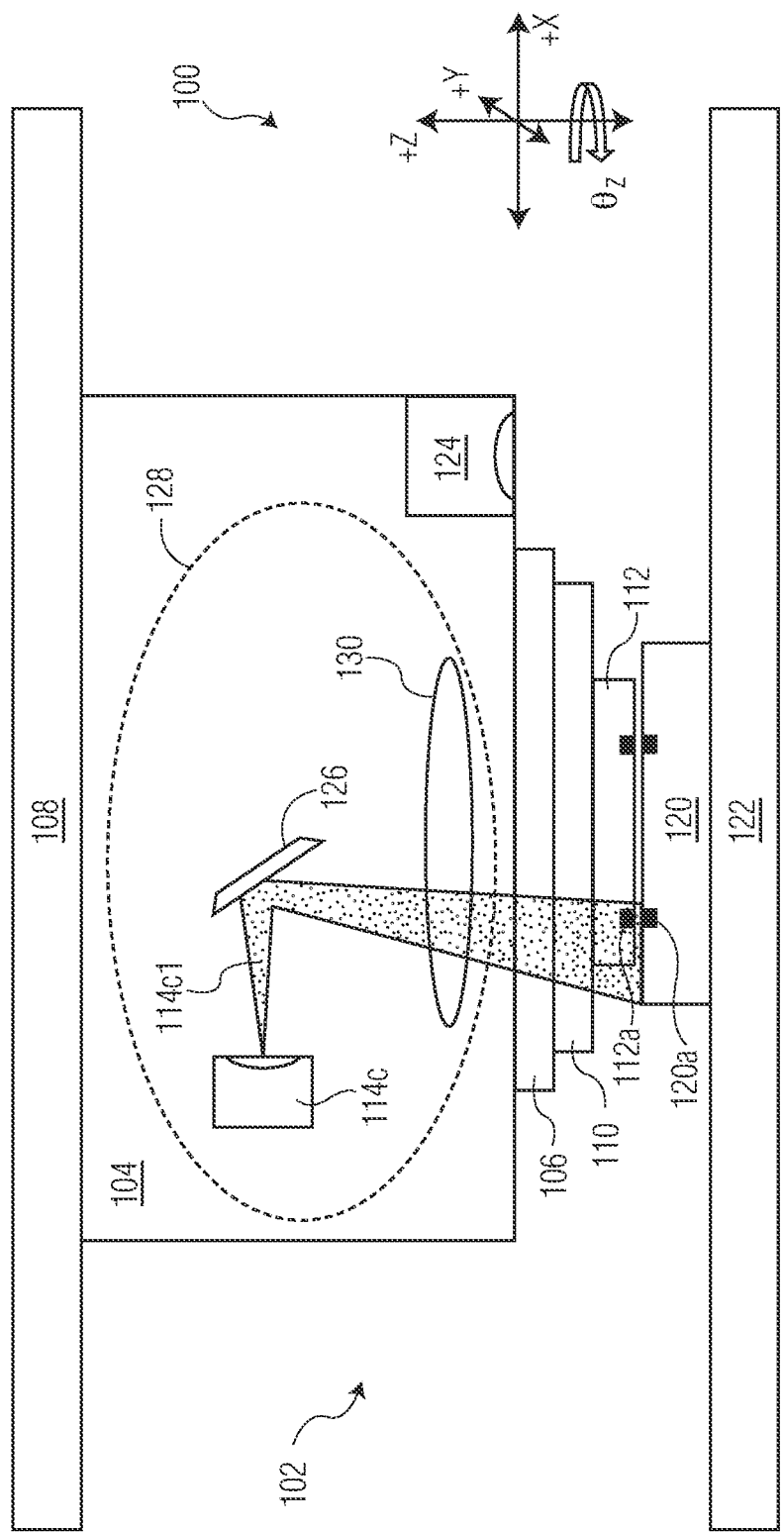
Figure 3F:
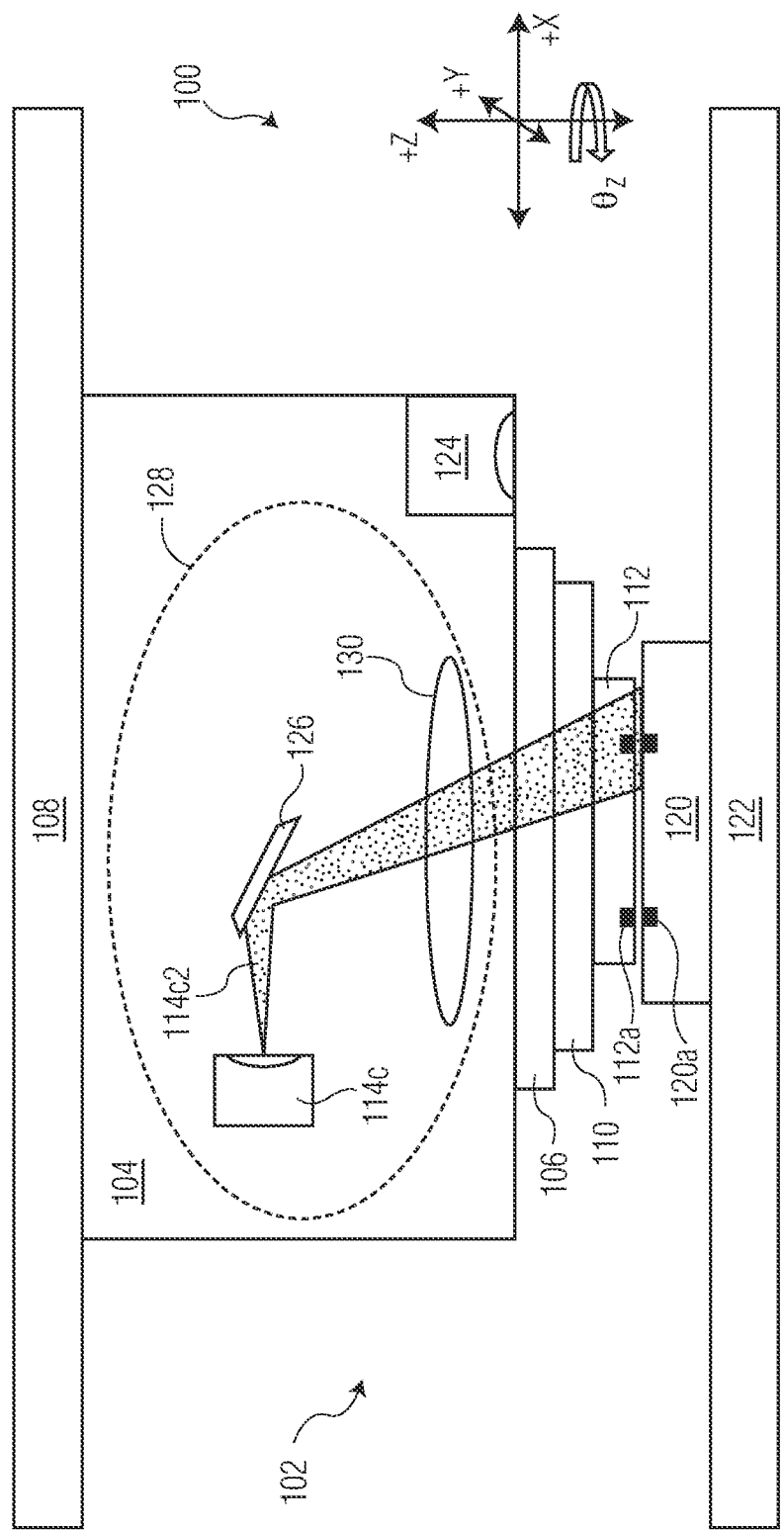

In FIG. 3E, imaging system 128 images along first optical path 114c1 to ensure alignment prior to a subsequent bonding step. In FIG. 3F, imaging system 128 images along second optical path 114c2 to ensure alignment prior to a subsequent bonding step. If the alignment detected in FIGS. 3E-3F are not satisfactory (e.g., according to some predetermined accuracy criteria), another adjustment(s) (as in FIG. 3D) may be made. If the alignment detected in FIGS. 3E-3F is satisfactory (e.g., according to some predetermined accuracy criteria), the process proceeds to FIG. 3G.

Figure 3G:
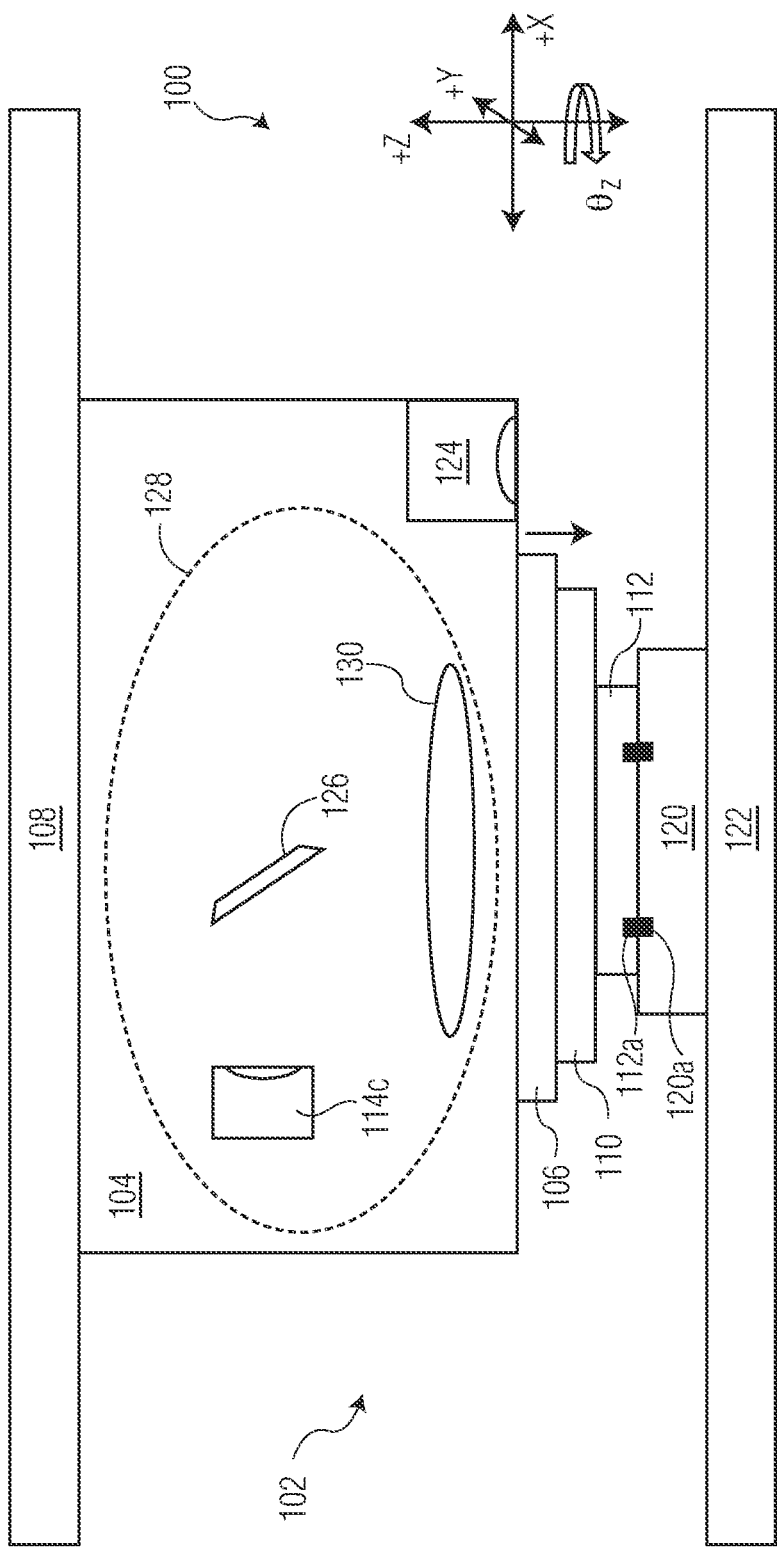
Figure 3H:
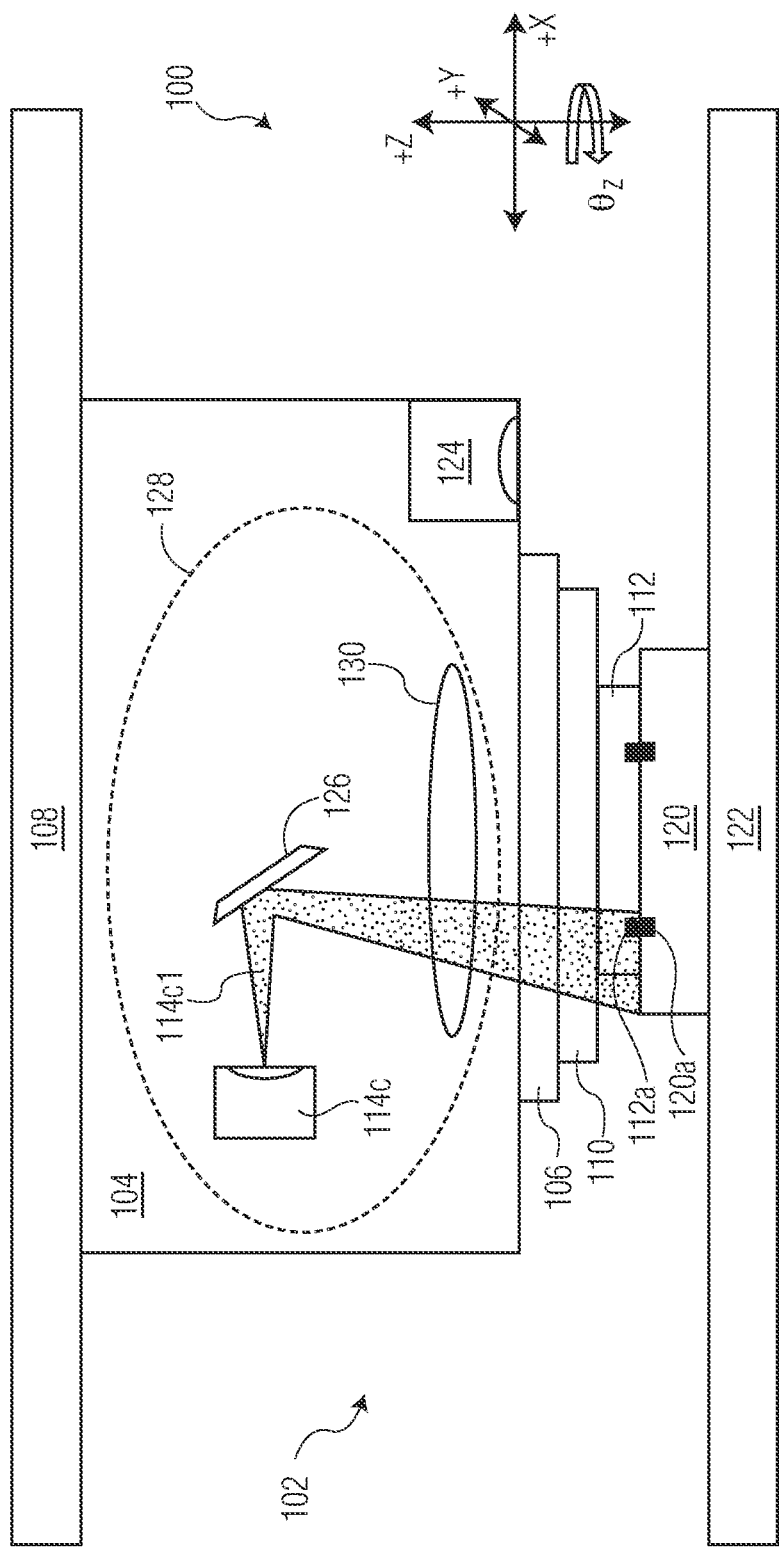

In FIG. 3G, die 112 is moved to contact substrate 120 in connection with a bonding step. In FIG. 3H, imaging system 128 images along first optical path 114c1 to confirm die 112 was bonded in a desired position. In FIG. 3I, imaging system 128 images along second optical path 114c2 to confirm die 112 was bonded in a desired position (i.e., a post place inspection process). In FIG. 3J, after bonding, bond head assembly 102 is moved away from substrate 120 (e.g., after releasing a die vacuum, fine motion system 106 may used to retract bond tool 110 from die 112). Although the post place inspection process is shown in FIGS. 3H-3I at the bonding height, it is understood that such a post place inspection can take place at other times and/or positions, for example, at a higher position after bonding is complete (e.g., at the position shown in FIGS. 3E-3F).

Although the invention is described primarily with respect to motion systems (e.g., coarse motion systems, fine motion systems, etc.) in a bond head assembly for aligning a die with a substrate, the invention is not limited thereto. That is, adjustments for coarse and/or fine alignment may be made by a substrate motion system (alone or in combination with motion systems in the bond head assembly).

Although the invention is largely described in connection with bond tools that are infrared transparent (or include an infrared transparent holding portion), the invention is not limited thereto. Aspects of the invention relate to imaging through a bond tool (e.g., see FIGS. 1F, 1H, 1J, 2B, 2D, 2F, 3B, 3C, 3E, 3F, 3H, and 3I). These imaging operations may be through an infrared transparent bond tool 110 (or a bond tool 110 including an infrared transparent holding portion). However, these imaging operations may be completed through apertures (or holes) in an appropriate part of the bond tool. Thus, in each of the drawings listed above (e.g., see FIGS. 1F, 1H, 1J, 2B, 2D, 2F, 3B, 3C, 3E, 3F, 3H, and 3I), bond tool 110 may be considered to include an aperture to allow for imaging operations. Other techniques of imaging through a bond tool are contemplated within the scope of the invention.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A die bonding system comprising:
a bond head assembly for bonding a single die to a substrate, the bond head assembly including a bond tool for holding the die prior to bonding the die to the substrate, the bond head assembly including a motion system for moving the bond tool along a plurality of axes prior to bonding of the die to the substrate, the die including a first plurality of fiducial markings, the substrate including a second plurality of fiducial markings; and
an imaging system configured for simultaneously imaging (i) one of the first plurality of fiducial markings and (ii) one of the second plurality of fiducial markings along a first optical path while the die is carried by the bond head assembly, the imaging system being carried by the bond head assembly,
the imaging system configured for simultaneously imaging (i) another of the first plurality of fiducial markings and (ii) another of the second plurality of fiducial markings along a second optical path while the die is carried by the bond head assembly,
each of the first optical path and the second optical path being independently configurable to image any area of the die including one of the first plurality of fiducial markings.

2. The die bonding system of claim 1 wherein the plurality of axes include an X-axis and a Y-axis of the die bonding system.

3. The die bonding system of claim 1 wherein the motion system is configured for moving the bond tool about a θ axis prior to bonding of the die to the substrate.

4. The die bonding system of claim 1 wherein the bond tool holds the die at a holding portion of the bond tool, the holding portion being formed from an infrared transparent material.

5. The die bonding system of claim 1 wherein the imaging system is an infrared imaging system.

6. The die bonding system of claim 1 wherein the first optical path includes a first camera, and the second optical path includes a second camera.

7. The die bonding system of claim 6 wherein the imaging system includes an optical element, the optical element being included in each of the first optical path and the second optical path.

8. The die bonding system of claim 7 wherein the first camera is configured for imaging from a first position above the optical element, and the second camera is configured for imaging from a second position along a side of the optical element.

9. The die bonding system of claim 1 wherein the imaging system is configured for imaging (a) the one of the first plurality of fiducial markings and the one of the second plurality of fiducial markings along the first optical path and (b) the another of the first plurality of fiducial markings and the another of the second plurality of fiducial markings along the second optical path simultaneously.

10. The die bonding system of claim 1 wherein the imaging system includes a camera, the camera being included in each of the first optical path and the second optical path.

11. The die bonding system of claim 10 wherein the imaging system includes a scanning mirror, the scanning mirror being configured to alternately provide for imaging of (a) the one of the first plurality of fiducial markings and the one of the second plurality of fiducial markings along the first optical path, and (b) the another of the first plurality of fiducial markings and the another of the second plurality of fiducial markings along the second optical path.

12. A die bonding system comprising:
a bond head assembly for bonding a single die to a substrate, the die including a first plurality of fiducial markings, the substrate including a second plurality of fiducial markings, the bond head assembly including a bond tool for holding the die prior to bonding the die to the substrate, the bond head assembly including a motion system for moving the bond tool along a plurality of axes prior to bonding of the die to the substrate; and
an imaging system configured for simultaneously imaging (i) one of the first plurality of fiducial markings and (ii) one of the second plurality of fiducial markings along a first optical path while the die is carried by the bond head assembly, the imaging system being carried by the bond head assembly,
the imaging system configured for simultaneously imaging (i) another of the first plurality of fiducial markings and (ii) another of the second plurality of fiducial markings along a second optical path while the die is carried by the bond head assembly,
the imaging system including (a) a first camera, (b) a second camera, and (c) an optical element included in each of the first optical path and the second optical path, the first camera imaging from a first position above the optical element, and the second camera imaging from a second position along a side of the optical element.

13. The die bonding system of claim 12 wherein the plurality of axes include an X-axis and a Y-axis of the die bonding system.

14. The die bonding system of claim 12 wherein the motion system is configured for moving the bond tool about a θ axis prior to bonding of the die to the substrate.

15. The die bonding system of claim 12 wherein the bond tool holds the die at a holding portion of the bond tool, the holding portion being formed from an infrared transparent material.

16. The die bonding system of claim 12 wherein the imaging system is an infrared imaging system.

17. The die bonding system of claim 12 wherein the imaging system is configured for imaging (a) the one of the first plurality of fiducial markings and the one of the second plurality of fiducial markings along the first optical path using the first camera, and (b) the another of the first plurality of fiducial markings and the another of the second plurality of fiducial markings along the second optical path using the second camera, simultaneously.

* * * * *